(12) United States Patent
Kilbourne et al.

(10) Patent No.: US 7,139,937 B1
(45) Date of Patent: Nov. 21, 2006

(54) METHOD AND APPARATUS TO ESTABLISH SAFE STATE IN A VOLATILE COMPUTER MEMORY UNDER MULTIPLE HARDWARE AND SOFTWARE MALFUNCTION CONDITIONS

(75) Inventors: Allen Kilbourne, Tracy, CA (US); Brad A. Reger, Dublin, CA (US); Steve Valin, Nevada City, CA (US)

(73) Assignee: Network Appliance, Inc., Sunnyvale, CA (US)

( * ) Notice: Subject to any disclaimer, the term of this patent is extended or adjusted under 35 U.S.C. 154(b) by 708 days.

(21) Appl. No.: 10/219,376

(22) Filed: Aug. 15, 2002

(51) Int. Cl.
G06F 11/00 (2006.01)

(52) U.S. Cl. .............. 714/47; 714/22; 714/43; 714/56; 710/110; 713/500

(58) Field of Classification Search ............ 714/34, 714/23
See application file for complete search history.

(56) References Cited

U.S. PATENT DOCUMENTS

| | | | | |
|---|---|---|---|---|
| 4,979,171 | A * | 12/1990 | Ashley | 370/525 |
| 5,276,888 | A * | 1/1994 | Kardach et al. | 710/261 |
| 5,692,202 | A * | 11/1997 | Kardach et al. | 713/324 |
| 5,781,784 | A * | 7/1998 | McKinley | 713/320 |
| 6,263,453 | B1 * | 7/2001 | Anderson | 714/22 |
| 2002/0026543 | A1 * | 2/2002 | Tojima et al. | 710/22 |

OTHER PUBLICATIONS

Raidtec Corporation, Press Release, 3 pages, Aug. 9, 2002.
Information about CompactFlash, CompactFlash Association, 2 pages, Aug. 21, 2000.
Intel® RAID Controller SRCMR, 3 pages, 2002.
Intel® RAID Controller SRCMR, Product Specifications, 3 pages, 2001.
Intel® Press Releases, 3 pages, 2002.
Cypress Semiconductor Corporation, Low-Cost 3.3V Zero Delay Buffer, 12 pages, Feb. 19, 2002.
Linear Technology, LTC1326/LTC1326-2.5, Micropower Precision Triple Supply Monitors, 16 pages, 1998.

* cited by examiner

*Primary Examiner*—Robert Beausoliel
*Assistant Examiner*—Yolanda L. Wilson
(74) *Attorney, Agent, or Firm*—John R. Ley

(57) ABSTRACT

Volatile memory is placed into a data-preserving safe state in a computer system in response to any one of a reduction in power applied to the volatile memory, a bus reset signal on a data communication bus of the computer system, and an absence of a bus clock signal on the bus. The volatile memory is powered from an auxiliary uninterruptible power supply in response to the reduction in power. The volatile memory is also placed into the data-preserving safe state in response to a cessation in executing software instructions by a CPU of the computer system. Placing the volatile memory into the safe state in response to and under these conditions enhances the opportunity to preserve data in response to error and malfunction conditions.

41 Claims, 8 Drawing Sheets

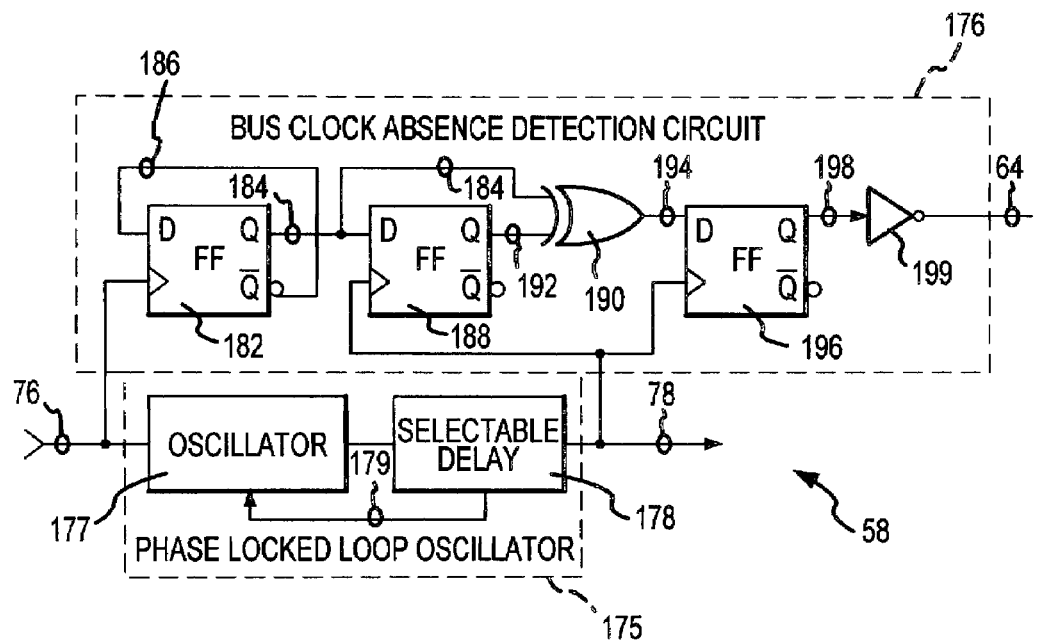
FIG.7
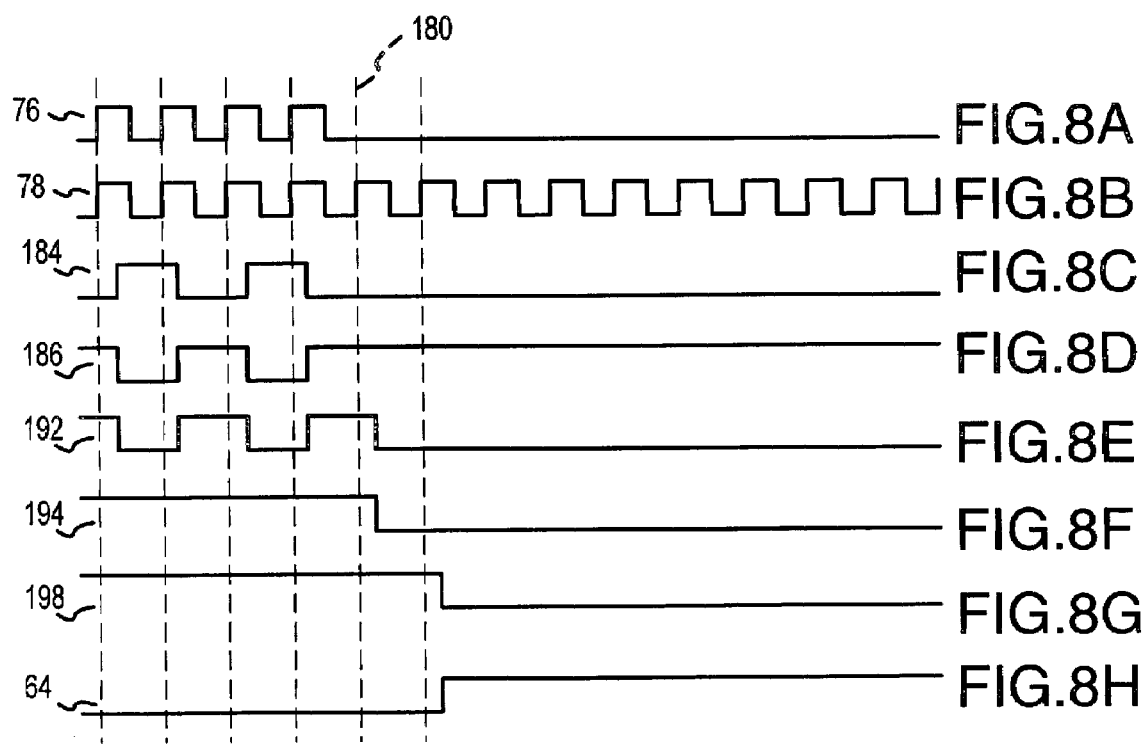

METHOD AND APPARATUS TO ESTABLISH SAFE STATE IN A VOLATILE COMPUTER MEMORY UNDER MULTIPLE HARDWARE AND SOFTWARE MALFUNCTION CONDITIONS

CROSS-REFERENCE TO RELATED APPLICATION

This invention and application are related to the following other invention: "Conversion Card and Method to Convert a General Purpose Personal Computer into a Dedicated Mass Storage Appliance," described in U.S. application Ser. No. 10/219,375. This application is filed concurrently herewith by some of the present inventors and is assigned to the assignee of the present invention. The disclosure of this related application is incorporated herein by this reference.

FIELD OF THE INVENTION

This invention relates to the storage of data in a memory of a computer system, and more particularly to a new and improved method and apparatus which effectively responds to the most common malfunction or error conditions to place volatile memory of the computer into a safe or self-refresh state, thereby preventing loss of the data as a result of the error conditions. The error conditions include a termination of functionality (a "crash") of the hardware or software, low or interrupted electrical power to the computer system, the assertion of a bus reset signal which would occur in response to resetting or powering-down the computer system, and the absence of a bus clock signal on a communication bus of the computer system. These conditions cover the vast majority of errors or malfunctions that might befall a computer system, and the present invention channels, consolidates and funnels these error conditions into a single response signal which establishes the safe state of the volatile memory, thereby improving data security and reliability.

BACKGROUND OF THE INVENTION

The ever-increasing use of modern computer systems has created an increased demand to store and utilize large masses of data. Mass data storage is economically achieved by using an array of relatively inexpensive or independent disk drives. Such "RAID" (redundant array of independent disks) systems also offer considerable benefits in data reliability because of their well-known ability to reconstruct lost or corrupted data. The typical RAID mass storage system requires a computer to control the array of disk drives as well as to control the transfer of data when performing read and write operations on the disk drives.

To store data reliably, the data should be saved completely on the RAID disk drives before a write transaction is acknowledged. If the computer ceases functioning ("crashes") as a result of a software hang-up or a hardware failure, or as a result of a power loss or reduction, or if the bus which transfers the data ceases to function because of a bus malfunction, before the data is saved completely to the disk drive, the data is lost. In general, the redundancy and reliability of data storage on a RAID storage system are available only after the data has been completely stored on the disk drives. Thereafter, failures or malfunctions of the disk drives will usually allow the data to be reconstructed.

Disk drives require a relatively long amount of time ("high latency") to perform a read or write transaction, because mechanical components must be moved to perform the operation. Because of the relatively high latency, the speed and performance of the computer system will be adversely affected if the storage transactions are performed directly on the disk drives. The higher latency of the disk drives limits mass storage performance because considerable time is unused while waiting for the disk drives to perform the data transactions.

To avoid the latency problem of disk drives, it is typical to use an intermediate, high performance ("low latency") solid-state memory upon which to perform the read and write data transactions. The data is transferred rapidly to the low latency intermediate memory, and then, in a separate transaction which does not adversely affect the processing performance, data is transferred from the intermediate memory to the disk drives. In this manner, the normal processing performance of the computer system is not diminished by mass storage transactions. However, should a crash, a power loss or a bus malfunction occur while the data is present in the intermediate memory and before the data has been completely transferred to the disk drives, that data will be lost and reconstruction of the data becomes impossible.

Intermediate solid-state memories have been made nonvolatile to maintain data in the event of power loss. Usually battery backup power is supplied to achieve such nonvolatility. Although certain types of solid-state memories have inherent nonvolatile characteristics, the semiconductor materials used in those types of memories to obtain inherent nonvolatile characteristics require greater time to write the data. Consequently, inherently nonvolatile memories generally have a relatively high, and therefore unacceptable, latency when performing read and write transactions. It is for this reason and others that inherent nonvolatile solid-state memories are not usually considered acceptable as intermediate nonvolatile memories in a mass storage computer system. Instead, low latency dynamic random access memories (DRAMs) with a battery backup are typically used as nonvolatile intermediate memories in a mass storage system.

In addition to intermediate memories in RAID mass storage systems, volatile DRAM is also widely used for storage during computations performed by a central processing unit or processor. Very low latency, high-performance memory is particularly important in computational situations because of the very high speed of modern processors. If memory read and write transactions are not performed as quickly as the processor executes instructions, the computational power of the computer system is diminished.

The typical DRAM requires refresh signals to be applied to it periodically in order to maintain the data written to it. The refresh signals are typically generated by circuitry external to the DRAM. So long as adequate power is available the external circuitry will continue to refresh the DRAM and therefore maintain the data within it. However, should a power interruption or reduction occur, it is necessary to place the DRAM into a self-refresh state and apply the battery power to the DRAM. In the self-refresh state, the DRAM automatically generates its own refresh signals, and the power to do so comes from the battery. It is essential that the DRAM be placed into the self-refresh state and the battery power be applied to it in order to assure non volatility of the data.

A similar situation exists with respect to a hardware or software crash or malfunction. In these cases, the usual technique for recovering from such malfunction condition is to power cycle the computer system by manually powering-down or terminating the application of power and then reapplying the power. If the memory is not placed into the self-refresh state and the battery power applied to it, powering-down the computer system when executing a power cycle will result in the loss of data within the volatile memory.

A hardware or software crash or malfunction can occur in a computer system from a variety of different causes. Some of the more common malfunction conditions are the unintentional loss of the main power to the computer system. Unintentional main power loss may occur while the computer systems operating normally and the applied AC mains power is interrupted or diminished because of a power distribution problem, a tripped circuit breaker, or a power cord is unintentionally disconnected, for example. Another malfunction condition may be caused by a sag in an internal voltage level within the computer system itself, such as the voltage which powers the logic circuits of a computer. A sag in the internal voltage may occur as a result of an AC power interruption or a malfunction of an internal power supply within the computer. Failing to adequately power the internal circuits within a computer can also result in a malfunction leading to a data loss. The loss of a bus clock signal on an internal peripheral expansion bus of the computer system is another malfunction condition. At the beginning of a normal power-down sequence, the typical computer system will maintain a bus clock signal on its peripheral expansion bus for sufficient amount of time to allow the components connected to the expansion bus to complete operations. However in some circumstances, the bus clock signal may cease before the memories are placed into the safe state. Powering-down or resetting the computer system is typically signaled by the assertion of a bus reset signal on the peripheral expansion bus. In response to the bus reset signal, the memory should place itself into the safe state. A hang up in the execution of the instructions by the processor of the computer system is also a malfunction condition. The typical way to avoid a software hang up is to reset or power-cycle the computer system, although some processors include watchdog circuits which will signal the event of a software hang up and attempt to clear the hang up condition before resetting the entire system. Lastly, some test and engineering equipment that may be connected to the computer system for diagnostic reasons may cause resetting at any time without warning. Malfunction conditions can result from other causes as well, but the vast majority of the malfunction conditions are characterized by or result from those situations described above.

SUMMARY OF THE INVENTION

The invention involves monitoring the status of key elements and functions of a computer system to detect the vast majority of common malfunction or error conditions, and in response, placing volatile memory into a safe state to prevent data loss upon the occurrence of the error condition. Monitoring the status of the a few key elements and functions consolidates, channels or funnels all of the major error conditions into a single safe-state enable response which is used to reliably place in the volatile memory into the safe or self-refresh state. Thereafter and depending on the error condition, the volatile memory may be connected to an auxiliary uninterruptible battery backup power source to maintain the data written in the volatile memory. The ability to place the volatile memory in the safe state is improved by selecting the key elements and functions of the computer elements to monitor and then converting indications of their status into a single response which places the volatile memory in the safe state. A complex variety of error conditions are channeled, consolidated and funneled into a single response which enables the safe-state of volatile memory in complex computer systems.

One aspect of the invention relates to a method of placing volatile memory into a data-preserving safe state in a computer system in response to any one of a reduction in power applied to the volatile memory, a reset signal on a data communication bus of the computer system, and an absence of a bus clock signal on the bus. An additional aspect involves placing the volatile memory into the data-preserving safe state in response to a cessation in executing software instructions by a CPU of the computer system. The volatile memory may also be powered from an auxiliary uninterruptible power supply in response to these conditions.

Another aspect of the invention also relates a method of placing volatile memory into a safe state. The method involves detecting an error condition caused by an absence of a bus clock signal which is normally present on a communication bus of the computer system, detecting an error condition caused by a level of voltage which is supplied to the volatile memory decreasing to a predetermined threshold which is lower than the normally supplied voltage level, or detecting an error condition caused by a presence of a bus reset signal which is normally absent on the bus. In response to any of these error conditions, the volatile memory is placed into a data-preserving safe state. Another error condition which places the volatile memory into the safe state is a cessation in executing software instructions by a CPU of the computer system. The bus reset signal is asserted in response to detecting the cessation in executing software instructions. The bus reset signal is also asserted in response to powering-down the computer system. A surrogate bus clock signal may be generated upon detecting the absence of the primary bus clock signal normally present on the bus, and the surrogate bus clock signal is applied to a memory controller to enable the memory controller to complete any pending data transactions to the volatile memory, thereby assuring that the data will be written to the volatile memory so that it can thereafter be preserved upon enabling the safe state. An auxiliary uninterruptible power supply may be connected to power the volatile memory while in the safe state. Many other significant functions are also a part of the method aspects of the present invention.

Another aspect of the present invention relates to a computer system. The computer system has a central processing unit (CPU) that executes software instructions, a memory component, and a communication bus connecting the CPU to the memory component. The bus normally carries a bus clock signal and may also carry a bus reset signal in connection with resetting the computer system. The memory component includes volatile memory having a self-generating data-preserving safe state of operation which is enabled in response to applying a safe state enable signal to the volatile memory. An error condition logic circuit is connected to the bus to receive the bus reset signal asserted on the bus and to apply the safe state enable signal to the volatile memory. A bus clock generator circuit is also connected to the bus to receive the bus clock signal and to assert a bus clock absence signal to the error condition logic circuit upon detecting an absence of the bus clock signal. A power monitor circuit is connected to the volatile memory to power the volatile memory, to monitor a level of voltage supplied to the volatile memory and to assert a low voltage warning signal to the error condition logic circuit upon the voltage level decreasing to a predetermined threshold which is lower than a level of voltage which is normally supplied to the volatile memory. The error condition logic responds to the assertion of any one of the bus reset signal, bus clock absence signal, or low voltage warning signal to apply the safe state enable signal to the volatile memory.

Other aspects of the computer system involve a watchdog circuit connected to the CPU to monitor the execution of software instructions by the CPU and to cause the CPU to assert the bus reset signal upon the watchdog circuit detecting a cessation in the execution of forwardly-progressive software instructions by the CPU. The watchdog circuit may assert the reset signal to the CPU upon detecting the absence of execution of forwardly-progressive instructions by the CPU within a predetermined time duration, and the watchdog circuit may assert a program interrupt signal to the CPU upon detecting the absence of execution of forwardly-progressive instructions by the CPU within a second predetermined time duration which is less than the predetermined time duration which results in the assertion of the bus reset signal. This permits the CPU to respond to the program interrupt signal to attempt to commence the execution of forwardly-progressive instructions without asserting the bus reset signal. A power on reset circuit may be connected to the CPU to cause the CPU to assert the bus reset signal upon reapplying power after powering-down.

The bus clock generator circuit generates a surrogate bus clock signal as a replacement for the primary bus clock signal upon detecting the absence of the primary bus clock signal normally present on the bus. A memory controller connected to the volatile memory performs memory transactions on the volatile memory in response to clock signals, and the surrogate bus clock signal is sufficient for the memory controller to complete any pending data transactions necessary to preserve the data in the volatile memory despite the occurrence of the error condition.

The power monitor circuit further includes a power selector which is connected to an auxiliary power supply and the power supply which powers the volatile memory under normal operating conditions. A further decrease in the level of voltage supplied to the volatile memory below the predetermined threshold which causes the safe state enable signal operatively connects the auxiliary power supply to power the volatile memory. In this manner, different thresholds of voltage may be monitored.

A more complete appreciation of the present invention and its scope may be obtained from the accompanying drawings, which are briefly summarized below, from the following detailed descriptions of presently preferred embodiments of the invention, and from the appended claims.

BRIEF DESCRIPTION OF THE DRAWINGS

FIG. 7 is a block and logic diagram of a bus clock generator of the memory shown in FIG. 2.

FIGS. 8A, 8B, 8C, 8D, 8E, 8F, 8G, and 8H are waveform diagrams of signals of the bus clock generator shown in FIG. 7, all of which are correlated with common time references.

DETAILED DESCRIPTION

The present invention relates to consolidating, channeling or funneling the major conditions which could lead to or create loss of data in a volatile memory of a computer system into a single response or enable signal which places memory components into a safe state to prevent data loss. Typically, the memories which are susceptible to data loss are volatile. Volatile memory does not inherently and permanently retain the data which is written to or recorded in it, but instead requires some type of continually applied action to maintain that data. The most common form of volatile memory is dynamic random access memory (DRAM). To retain the data in a DRAM, the individual data-retaining memory cells (typically capacitors) must be periodically refreshed or electrically recharged to maintain the electrical charge condition which represents the data. If not periodically refreshed, the electrical condition or charge dissipates, resulting in the loss of the data.

The most typical causes of malfunctions in a computer system which could lead to the loss of data in memory are a manually-executed power-down of the computer system when it is otherwise operating properly, interrupted or lost power to the computer system, a hardware malfunction or a software malfunction resulting in the cessation of execution of instructions, sometimes called a "hang" or "crash," and the cessation of communication of data between components of the computer system over a communication bus which connects the components. All of these malfunctions have the potential of causing the loss of data which has been written in volatile memory of the computer system. Without placing the volatile memory in the safe state under these conditions, there is a high probability that the data will be irretrievably lost as a result of the malfunction condition itself, or as a result of clearing or resolving the malfunction condition. The present invention relates to improvements in placing volatile memory into a safe state in response to the malfunction conditions.

Figure 1:
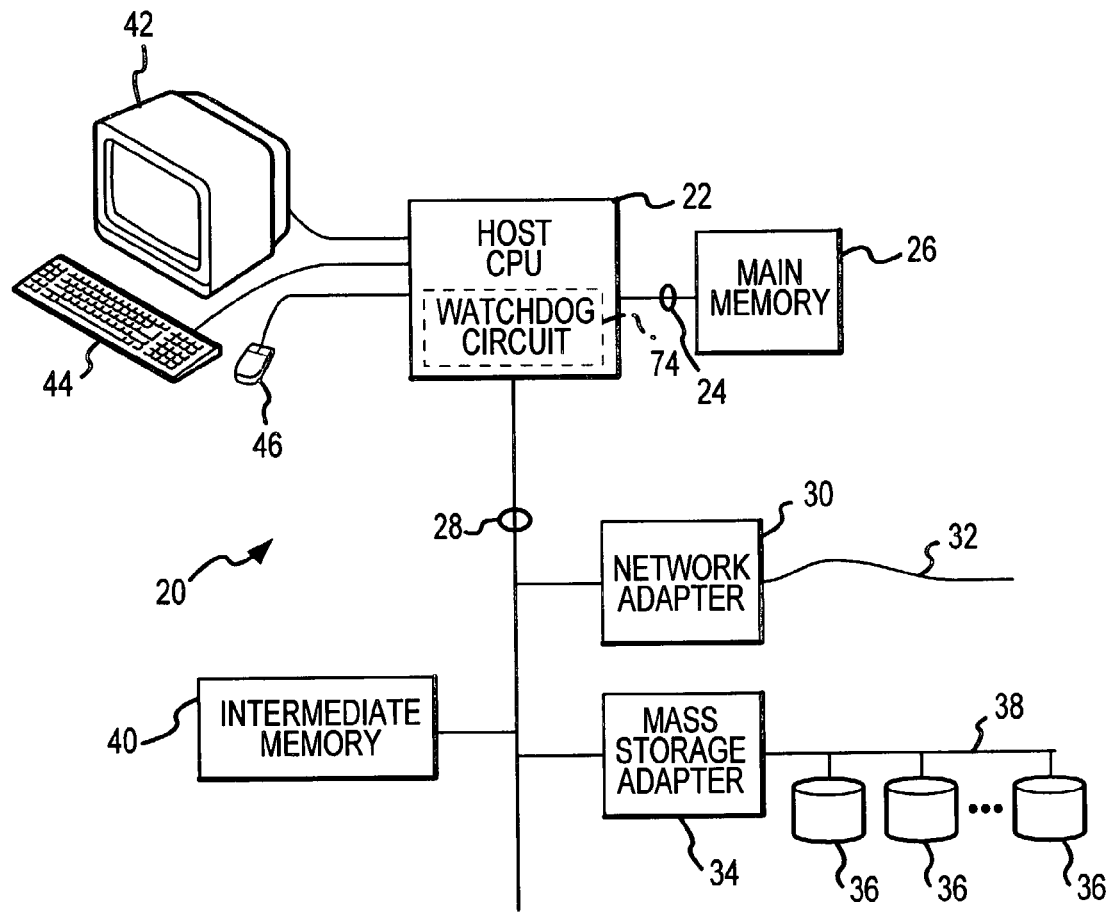
FIG. 1 is a block and illustrative diagram of a computer system, including a RAID mass storage system, in which the present invention is incorporated.

The improvements of the present invention are generally applicable to computer systems of the exemplary type 20 shown in FIG. 1. The computer system 20 includes a conventional main or host processor or central processing unit (CPU) 22, a conventional high-performance main bus 24 and a conventional main memory 26. The CPU 22 performs data processing functions. The main memory 26 holds the data used by the CPU 22 in performing the calculations. The main memory 26 also holds the data which constitutes the results of the calculations until such data is stored or transferred to other memory of the system 20. The main memory 26 also holds the software which defines instructions of the programs and tasks performed by the CPU 22. The local bus 24 transfers the data and the instructions between the CPU 22 and the main memory 26.

At least one conventional peripheral component interconnect (PCI) or expansion bus 28 is also part of the computer system 20. The expansion bus 28 is connected to the CPU 22, and the expansion bus 28 serves as the primary means to connect a variety of peripheral components to the computer system 20, thereby expanding the functionality of the computer system 20. The expansion bus 28 is separate from the main bus 24. The expansion bus 28 is usually somewhat slower in performance compared to the main bus 24, but the expansion bus 28 is adequate to transfer the data and information between the devices connected to the bus 28 and the CPU 22 and/or the memory 26.

One of the typical peripheral components connected to the expansion bus 28 is a network adapter 30. The network adapter 30 connects the computer system 20 to a local area network, a wide area network, or some other form of a communication medium 32 by which to transfer data between the computer system 20 and other components connected to the communication medium 32.

In the case of the computer system 20 functioning primarily as a mass storage server and primarily performing conventional mass data storage functions, a mass storage adapter 34 is connected to the expansion bus 28. A plurality of relatively inexpensive mass storage disk drives 36 are connected by a separate mass storage bus 38 to the mass storage adapter 34. The mass storage bus 38 may take the form of any conventional bus which permits communication between the mass storage adapter 34 and each of the disk drives 36. One example of a mass storage bus 38 is a conventional standard computer small interface ("SCSI") bus. The mass storage adapter 34, the plurality of disk drives 36 and their interconnection mass storage bus 38 form a conventional redundant array of inexpensive or independent disks (RAID) mass storage system. The mass storage adapter 34 may contain the necessary independent functionality to perform typical RAID mass storage functions in conjunction with the other components of the computer system 20. The mass storage adapter 34 may contain its own CPU and its own volatile memory (neither shown) which is used to perform the typical RAID mass storage functions.

When the computer system 20 functions primarily as a mass storage server, the main memory 26 is loaded with the instructional code defining a mass storage operating system (MSOS). The MSOS is preferably implemented as computer-executable code for managing data access and implementing file symantics. The MSOS can be implemented as an application program operating over a general-purpose operating system, such as UNIX (registered trademark) or Windows NT (registered trademark), or as a general-purpose operating system with configurable functionality for mass storage applications. For example, the MSOS can take the form of a microkernel, such as the Data ONTAP (trademark) operating system available from Network Appliance of Sunnyvale, Calif., the assignee hereof.

A conventional intermediate memory 40 is typically connected to the expansion bus 28. The intermediate memory 40 augments the capacity of the main memory 26 by also holding data which has been processed by the host CPU 22. The intermediate memory 40 may also hold data used by and supplied to devices connected to the expansion bus 28. Further still, the intermediate memory 40 may hold copies of data transferred between the main memory 26 and the RAID mass storage system until that data is successfully stored in the RAID mass storage system, when the computer system 20 functions as a mass storage server.

The use of the intermediate memory 40 makes the CPU 22 more efficient, by not unduly restricting the computational performance of the CPU 22 while data read and data write transactions are performed. The intermediate memory 40 has the capability to perform read and write operations with relatively low latency or short time delays, thereby permitting data to be transferred between the intermediate memory 40 and the CPU 22 and/or the main memory 26 with relatively high speed. The intermediate memory 40 typically has a higher latency than the main memory 26, but a considerably lower latency than the other components connected to the expansion bus 28. Rather than always requiring the CPU 22 and the main memory 26 to interact directly with the much higher latency RAID disk drives 42 or the relatively high-latency peripheral devices connected to the expansion bus 28, the intermediate memory 40 may perform an intermediate data holding functionality which allows the host CPU 22 to perform other functions while the data is accumulated in the intermediate memory from the higher latency components of the computer system. Under these circumstances, the performance of the host CPU 22 is not impeded by the higher latency memory components of the computer system. The use of the intermediate memory 40 in this manner to enhance the performance of a computer system is well known.

Another use of an intermediate memory is exemplified in one type of typical RAID mass storage computer system. A copy of the data that is to be written from the main memory 26 to the disk drives of the RAID storage system is also written in the intermediate memory. After the data has been acknowledged as successfully written to the disk drives of the RAID storage system, the copy is cleared from the intermediate memory. The process is then repeated with other data. If an error condition occurs before the data has been successfully written to the disk drives of the RAID storage system, the copy from the intermediate memory is used to rebuild the data in the main memory 26 so the data can thereafter then be written to the RAID system disk drives after the error condition has been corrected. In this regard, and because of the different types of errors which might occur, it is advantageous to make the intermediate memory nonvolatile. Making the intermediate memory nonvolatile assures that the copy of the data within it will survive almost all of the different types of common errors, including those involving the loss of electrical power.

Conventional input/output (I/O) devices such as a monitor 42, a keyboard 44 and mouse 46, are also part of the typical computer system 20. These I/O devices 42, 44 and 46 allow the user to control and modify the functionality of the computer system, as permitted by the programs executed.

Figure 2:
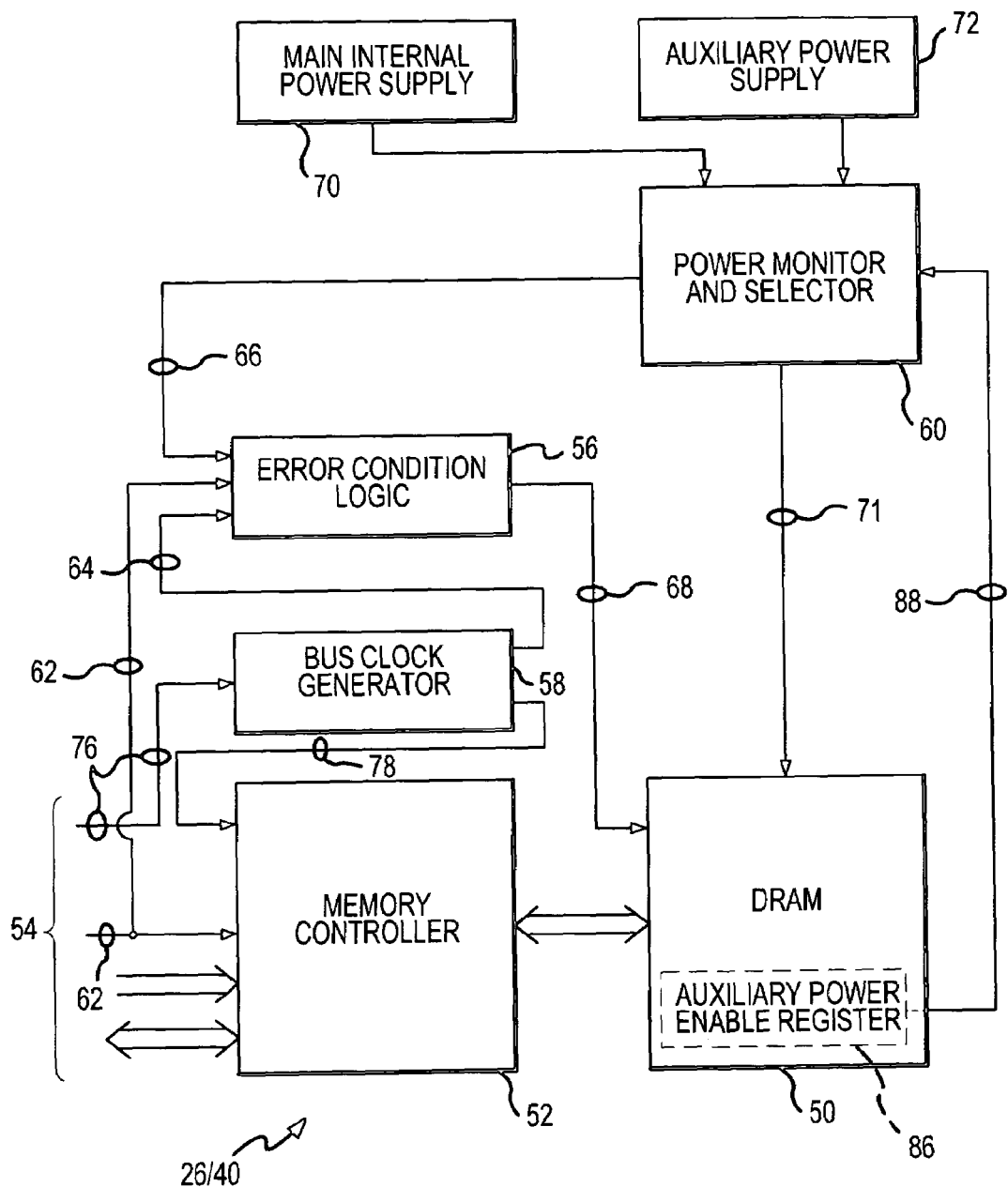
FIG. 2 is a block diagram of either a main or intermediate memory of the computer system shown in FIG. 1.

The main memory 26, the intermediate memory 40 and other low latency memory of the computer system 20 typically include conventional dynamic random access memory (DRAM) 50, as shown in FIG. 2. The use of DRAM as relatively low latency, high-performance memory achieves many advantages: it has relatively low latency, thereby allowing the read and write transactions to be performed more rapidly; it is relatively inexpensive; and it has a relatively large amount of memory cells to hold data, thereby achieving a relatively high storage capacity and storage density; among other things.

The main memory 26, the intermediate memory 40 and other low latency memory of the computer system 20 also typically include a conventional memory controller 52 connected to the DRAM 50. The memory controller 52 is connected to the bus 24 or 28 to which the memory 26 or 40 itself is respectively connected. The memory controller 52 performs and supervises the read and write transactions in response to signals supplied over conductors 54 of the bus 24 or 28 to which the memory controller 52 is connected. The memory controller 52 sometimes includes its own CPU and its own memory (neither shown).

Although using DRAM for the memory components 24 or 40 offers many advantages, one disadvantage of DRAM is that it is volatile. The volatility of the DRAM occurs because it does not inherently and permanently retain the data which is written or recorded to it. To retain the data, the data-retaining components (typical capacitors) of the DRAM must be periodically refreshed or electrically recharged to maintain the data. If not periodically refreshed, the electrical charge which represent the data dissipates, resulting in lost data.

Normally, an external circuit supplies refresh signals to maintain the data in a typical DRAM. Typically, a memory controller connected to the DRAM has dedicated circuitry which performs this function by periodically delivering the refresh signals. However, should malfunction in the external circuitry inhibit or terminate the delivery of the refresh signals, the data in the DRAM will be lost. To avoid complete reliance on the external circuitry for generating the refresh signals, most typical DRAM includes a self-refresh capability. Enabling the self-refresh functionality causes the DRAM to enter a self-refresh state of functionality in which internal circuitry within the DRAM self-generates its own refresh signals to preserve the data within the DRAM. Enabling the self-refresh state of functionality places the DRAM into a safe state to preserve the data without concern that the external circuitry may become inoperative or malfunction.

Another aspect of placing the DRAM in a safe state is to supply electrical power to the DRAM from a power source which is not subject to interruption or reduction under such a malfunction condition. Even if the DRAM is placed into the self-refresh state of functionality, the data will still be lost if electrical power is not available to the DRAM. By powering the DRAM from an auxiliary or external uninterruptible power source such as a battery, the data within the DRAM will be maintained under conditions of an unanticipated interruption or reduction in the commercially supplied AC mains power which normally powers the computer system. It may not be necessary to power the DRAM from the auxiliary power source under all malfunction or error conditions, if the conventional AC mains power source and the internal power supplies remain reliable. However, when a malfunction or error does occur, the computer system will be reset, and that reset may be achieved by powering-down the computer system. Placing the DRAM into the self-refresh state of operation and powering the DRAM by a separate auxiliary power source upon the occurrence of error conditions places the DRAM into a safest state possible for maintaining its data.

When the DRAM is placed into a self-refresh mode of operation, the amount of power consumed to refresh it is also diminished compared to normal power consumption. Since the power to execute the self-refresh capability will normally be supplied by a battery auxiliary power source, the reduced power consumption of the DRAM during the self-refresh mode of operation contributes to maintaining the data within the DRAM for an extended period of time. Extending the longevity of maintaining the data within the DRAM is desirable, because a considerable amount of time may expire before the error condition is resolved or cleared.

In addition to the DRAM 50 and the memory controller 52, which are typical components of most computer system memory, the present invention also involves the use of an error condition logic circuit 56, a bus clock generator 58, and a power monitor and selector 60. The error condition logic 56 responds to a primary bus reset signal 62, to a bus clock absence signal 64, and to a low voltage warning signal 66. The signals 62, 64 and 66 are asserted upon the occurrence of a major malfunction or error in the computer system 20 (FIG. 1). The error condition logic 56 functions as an OR gate 67 (FIG. 3), and responds to the assertion of one or more of the bus reset signal 62, the bus clock absence signal 64 and the low voltage warning signal 66 by asserting a safe state or self-refresh enable signal 68. The self-refresh enable signal 68 is applied to the DRAM 50 to place the DRAM into the self-refresh state of operation. As a consequence, data written to the DRAM 50 is placed into a safe state, so long as power remains applied to the DRAM 50.

The power monitor and selector 60 is connected to monitor at least one and preferably a plurality of voltages of a main internal power supply 70 for the computer system 20 (FIG. 1). Under normal operating circumstances, the power monitor and selector 60 supplies power from the main internal power supply 70 to the DRAM 50 over a power conductor 71. However, upon a determination that a voltage from the main internal power supply 70 has decreased, the power monitor and selector 60 connects an auxiliary or battery power supply 72 to power the DRAM 50 over the power conductor 71. Accordingly, the power monitor and selector 60 automatically assures that the DRAM 50 receives power from the auxiliary power supply 72 upon the error condition of reduced or interrupted power from the main internal power supply 70. The internal power supply 70 receives its power from the conventional AC mains power (not shown) which is applied to the computer system. In addition, the voltage or voltages from the internal power supply 70 also reflects or reflect the proper functionality of internal power supplies within the computer system which convert the conventional AC mains power to the voltage level or levels required by the components of the computer system.

The power monitor and selector 60 supplies the low voltage warning signal 66 upon detecting a predetermined reduction in at least one of the voltages from the main internal power supply. In response to the low voltage warning signal 66, the error condition logic 56 asserts the self-refresh enable signal 68. Placing the DRAM 50 into its self-refresh state, in conjunction with the power monitor and selector 60 applying power from the auxiliary power source 72 to the DRAM 50, places the DRAM 50 into a safe state to preserve the data within the DRAM. Without preservation, the data in the DRAM 50 would be irretrievably lost once the low or interrupted internal voltage malfunction condition is resolved.

Another malfunction or error condition which would result in the loss of data in the DRAM 50, unless the DRAM is placed in the safe state, is an intentional power-down of the host CPU 22 (FIG. 1). An intentional power-down is executed by manually removing and then reapplying electrical power to the computer system. Under such a manual power-down condition, the primary bus reset signal 62 is generated by the conventional power-down functionality of the host CPU 22. The bus reset signal 62 is delivered to the memory 26 or 40 over one of the conductors 54 of the expansion bus 28. Under normal power-down conditions, the bus reset signal 62 is supplied by the host CPU 22 just before the electrical power to the computer system 20 (FIG. 1) is terminated. Delivering the bus reset signal 62 before terminating the power allows the other components of the computer system which are connected to the expansion bus 28 to respond to the bus reset signal 62 by entering a safe state before the power is actually terminated.

In some computer systems, the bus reset signal 62 may be delivered simultaneously with terminating the electrical power, or the power may actually terminate before the bus reset signal 62 is delivered. In the latter circumstance, the power monitor and selector 60 will assert the low voltage warning signal 66 independently of and before the assertion of the bus reset signal 62. The low voltage warning signal 66 will result in the assertion of the self-refresh enable signal 68 to the DRAM 50, without reliance upon the bus reset signal 62. Of course, as the voltages of the main internal power supply 70 decrease, the power monitor and selector 60 will also automatically connect power from the auxiliary power supply 72 to the DRAM 50. Thus, even if the bus reset signal 62 is delivered late relative to power termination, or not at all, the DRAM 50 will still be placed in the safe state.

Another malfunction or error condition which could cause the loss of data unless the DRAM 50 is placed in the safe state, results from a hardware or a software crash or malfunction of the host CPU 22 (FIG. 1). A hardware or software crash is detected by a prior art watchdog circuit 74 which is connected to the host CPU 22, as shown in FIG. 1. Upon sensing the discontinuance or cessation in the execution of forwardly-progressive instructions, the watchdog circuit 74 causes the bus reset signal 62 to be asserted over the bus 28, where it is received by the error condition logic 56 of the memory 26 or 40 (FIG. 2). A similar situation exists if the host CPU 22 or any of the hardware connected to it malfunctions to the point where the CPU 22 can no longer execute programmed instructions. The watchdog circuit 74 causes the bus reset signal 62 to be asserted in this circumstance as well. More details concerning the prior art watchdog circuit 74 are described below in conjunction with FIGS. 9 and 10.

Another condition which could result in the loss of data unless the DRAM 50 is placed in the safe state is a malfunction of the expansion bus 28. The functionality of the expansion bus 28 is indicated by the continual presence of a primary bus clock signal 76. The bus clock signal 76 is applied over one of the conductors 54 of the expansion bus 28 (FIG. 1). The bus clock signal 76 is in essence a series of clocking pulses caused by the oscillation of the voltage between opposite digital logic levels, as is well known. The regular occurrence of pulses of the bus clock signal 76 is necessary to achieve normal bus operation. The absence of the bus clock signal 76 indicates a malfunction of the expansion bus 28. A malfunction of the expansion bus 28 prevents the transfer of data to and from the DRAM 50, thereby compromising or destroying the reliability of the data.

An expansion bus malfunction could occur independently of a software or hardware malfunction of the host CPU 22 (FIG. 1), or a loss or termination of power from the main internal power supply 70. The bus clock generator 58 monitors the regular occurrence of pulses of the primary bus clock signal 76. Upon detecting the absence of the primary bus clock signal 76, the bus clock generator 58 delivers the bus clock absence signal 64 to the error condition logic 56. The error condition logic 56 recognizes the bus clock absence signal 64 as indicating an error or malfunction condition and asserts the self-refresh enable signal 68 to place the DRAM 50 into the self-refresh state. Until such time as the voltage from the main internal power supply 70 diminishes, the power monitor and selector 60 maintains power to the DRAM 50 from the internal power supply 70. If the error which resulted in the absence of the bus clock signal 76 can only be resolved by powering-down and reapplying power to the computer system, the power monitor and selector 60 will then connect the DRAM 50 to the auxiliary power supply 72.

In addition to asserting the bus clock absence signal 64, the bus clock generator 58 also generates a surrogate bus clock signal 78. The surrogate bus clock signal 78 has essentially the same frequency and pulse characteristics as the primary bus clock signal 76. In addition, the pulse characteristics of the surrogate bus clock signal 78 have a zero phase delay relative to the pulse characteristics of the primary bus clock signal 76. In all regards, during normal operation, the surrogate bus clock signal 78 appears identical to the primary bus clock signal 76. For this reason, the memory controller 52 responds to the surrogate bus clock signal 78 as though it would respond to the primary bus clock signal 76.

The bus clock generator 58 continues to generate the surrogate bus clock signal 78 for a predetermined time after the bus clock signal 76 has terminated. The continued pulses of the surrogate bus clock signal 78 are sufficient for the memory controller 72 to take any remaining actions necessary to fully complete any pending memory transactions to write data completely to the DRAM 50. Thus, the absence of the bus clock signal 76 does not inhibit the completion of the write transaction to the DRAM 50, thereby assuring that the data associated with the memory transaction is loaded into the DRAM 50 where it is thereafter preserved as a result of the DRAM 50 being placed in the safe state. More details concerning the bus clock generator 58 are described below in conjunction with FIGS. 7 and 8A to 8H.

Figure 4:
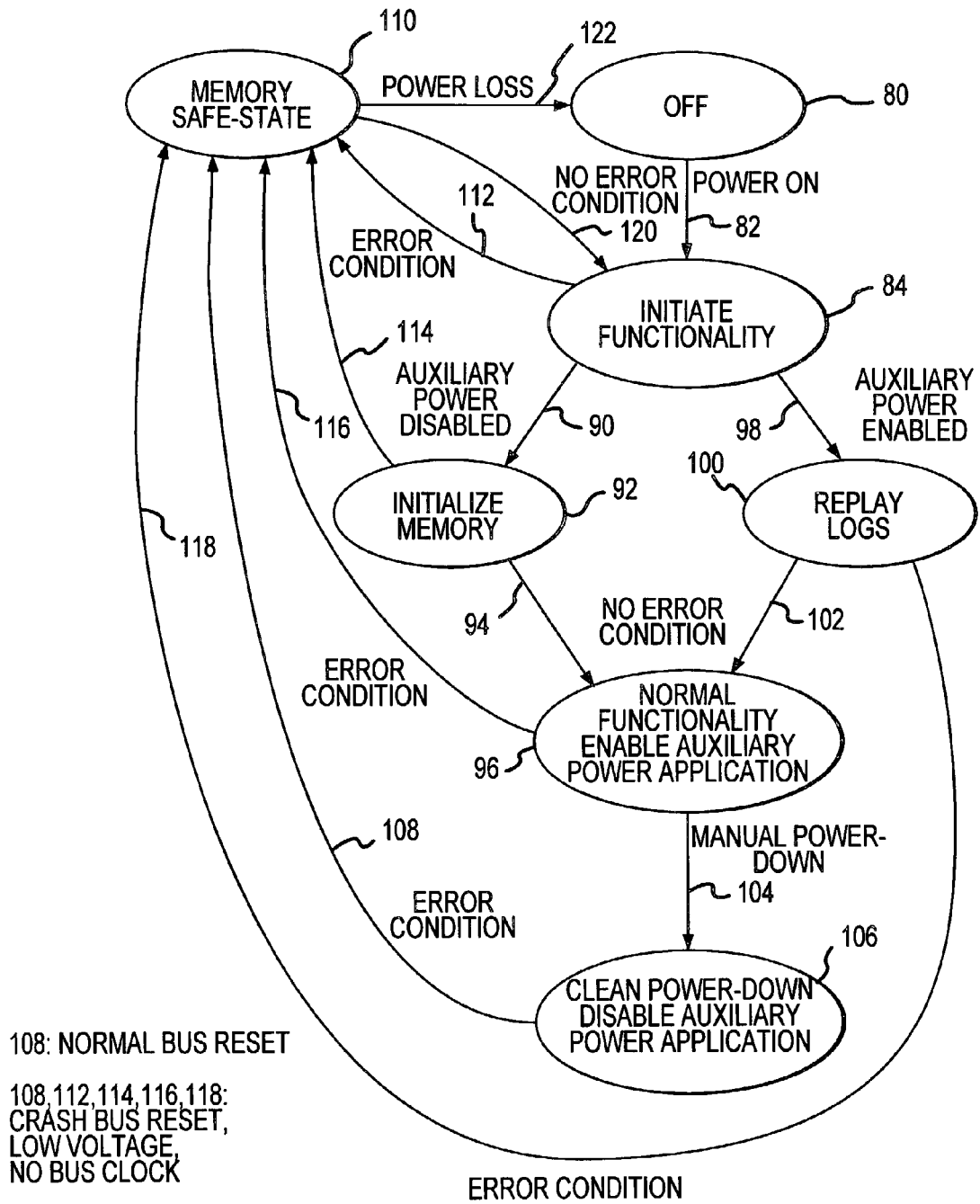
FIG. 4 is a state transition diagram illustrating the functionality of the present invention in the computer system shown in FIG. 1.

The interaction of the present invention with the computer system 20 (FIG. 1) is illustrated by the state transition diagram shown in FIG. 4. An "off" state 80 indicates that the computer system is in a normal nonfunctional state. In other words, the software and operating system of the computer system have executed a normal power-down sequence. The power from the internal power supply 70 (FIG. 2) has been terminated normally, and power has not been delivered from the auxiliary power supply 72 (FIG. 2) to the DRAM 50. Powering on the computer system establishes a transition 82 from the off state 80 to an "initiate functionality" state 84.

In the initiate functionality state 84, the host CPU 22 (FIG. 1) and its conventional associated core chip set (not shown) have commenced normal booting or loading of the operating system and application programs to be executed. At an appropriate point, the software executing on the host CPU 22 (FIG. 1) determines the status of a signal in a register 86 of the DRAM 50, shown in FIG. 2. The signal in the register 86 indicates whether an election has been made to enable the power monitor and selector 60 to apply power from the auxiliary power supply 72 to the DRAM 50 under low voltage error conditions. The selection signal is loaded into the register 86 under normal operating conditions. The signal in the register 86 which enables the application of auxiliary power is applied at 88 to the power monitor and selector 60, thereby enabling the functionality of the power monitor and selector 60 to apply the power from the auxiliary power supply 72 over the power conductor 71 to the DRAM 50.

Locating the register 86 within the DRAM 50 causes the signal 88 in the auxiliary power enable register 86 to become nonvolatile. Thus, the auxiliary power enable signal 88 in the register 86 is preserved under error or malfunction conditions, just as data within the DRAM 50 is preserved under error conditions. In the circumstance where a user of the computer system 20 (FIG. 1) has elected not to power the DRAM 50 from the auxiliary power supply 72 under an error condition, data within the DRAM 50, including the signal in the register 86, will be lost upon the occurrence of a power reduction or interruption. Under those circumstances, a lack of a signal in the register 86 after recovery from the error condition indicates that the auxiliary power to the DRAM 50 has not been previously selected and therefore the DRAM 50 does not contain reliable data.

During the initiation of normal functionality state 84, shown in FIG. 4, the status of the register 86 (FIG. 2) is determined by communicating signals with the register 86 over the bus conductors 54 (FIG. 2). A determination that the auxiliary power application to the DRAM was not enabled is indicated by a transition 90 to a "initialize memory" state 92 were the volatile memory is initialized. In the state 92, power is simply applied to the volatile memory and it is placed into a known initial state; no attempt is made to recover any data from the volatile memory. If auxiliary power was not applied to the volatile memory there is no possibility that the volatile memory retained any valid data. Consequently, in the state 92, the volatile memory is powered up and is placed into the initial known state so that data thereafter written to the volatile memory will be valid. Functionality thereafter transitions at 94 to a "normal functionality" state 96. In the normal functionality state 96, the software and hardware of the computer system 20 (FIG. 1) perform in a normal manner.

On the other hand, if the software initiating the functionality of the computer system recognizes at state 84 that the auxiliary power enable register 86 (FIG. 2) contains a signal indicating that auxiliary power application to the volatile memory was enabled, the data within the DRAM 50 should be valid data. Under these circumstances, a transition 98 from state 84 to state 100 causes the execution of a conventional routine or task called "replaying the logs." Replaying the logs allows the recovery of the correct data which existed prior to the error condition. In the context of one typical mass storage computer system, the data in the main memory 26 was destined to be written to the mass storage disk drives 36 (FIG. 1) of the RAID mass storage system, but the data transaction was interrupted and not written completely to the RAID mass storage system because of the error condition. The operations performed in the replay logs state 100 involve reading the copy of the valid data preserved in the DRAM, building new and correct data structures in the main memory 26 (FIG. 1) based on the valid data, and then writing that valid data from the main memory 26 to the RAID mass storage system. Once the operations of the replay logs state 100 have been completed, a transition 102 occurs to the normal functionality state 96.

In the normal functionality state 96, the hardware and software of the computer system perform in the normal and intended functional manner. In a general sense and in accordance with the present invention, part of the normal functionality in the state 96 will be to enable the auxiliary power application by writing a signal to the auxiliary power enable register 86 of the DRAM 50 (FIG. 2) in the manner described above. In this manner, any error or malfunction condition will result in placing the volatile memory into a safe state. However, if it is desired not to enable the auxiliary power application for whatever reason, a signal is not written to the auxiliary power enable register 86 (FIG. 2) at the state 96.

While operating in the normal functionality state 96, the user may decide to power-down the computer system. Such selected action is illustrated by the transition 104. The transition 104 places the computer system into a "clean power-down" state 106. In the clean power-down state 106, the software executing on the host CPU 22 (FIG. 1) delivers the bus reset signal 62 (FIGS. 2 and 3) in the course of executing a normal power-down sequence. The delivery of the bus reset signal causes a transition 108 to a "memory safe" state 110 where the volatile memory is placed in the safe state. As described above, the memory safe state 110 is achieved by enabling the self-refresh functionality of the DRAM 50 and, when needed, by applying power from an auxiliary or battery power source 72 to the DRAM 50 (FIG. 2).

Transitions 112, 114, 116 and 118 from the states 84, 92, 96 and 100, respectively, to the memory safe state 110 occur under any of the error or malfunction conditions: a hang or crash of the hardware or software executing on the host CPU (as determined by the watchdog circuit 74, FIG. 1); a low or interrupted power condition (as determined by the power monitor and selector 60, FIG. 2); or an absence of the bus clock signal (as determined by the bus clock generator 58, FIG. 2). These error conditions can occur at any time that the functionality resides in the states 84, 92, 96 and 100. In each case, the transitions 112, 114, 116 and 118 place the volatile memory in the memory safe state 110. In addition, should one of the error conditions occur during the course of executing a clean power-down while in state 106, but before the normal clean power-down sequence has asserted the bus reset signal, the transition 108 will also occur as a result of a hardware or software crash, low or interrupted voltage or the absence of the bus clock signal.

The memory safe state 110 is maintained until the error condition is cleared or resolved. Under those circumstances a transition 120 occurs to the state 84, where the normal functionality of the computer system is again initiated. Of course, initiating the normal functionality will involve replaying the logs at state 100 if auxiliary power has been enabled to maintain any data within the volatile memory. Under the unlikely circumstance where power from the auxiliary power supply 72 (FIG. 2) has been completely consumed while the memory is in the safe state 110, a transition 122 from the memory safe state 110 to the off state 80 occurs. In that circumstance, any data in the volatile memory has been lost because of the loss of power from the auxiliary power supply. There is no data preserved in the volatile memory, and therefore there is no reason to attempt to recover any valid data. In this case, the functionality of the computer system commences from its normal off state 80.

In the manner described, substantially all of the hardware and software errors and malfunctions that might befall a computer system have been consolidated. In response to these error conditions the single self-refresh enable signal 68 which is delivered to volatile memory to place it in a safe state. Moreover, power for maintaining the data in the volatile memory is automatically connected to the volatile memory under low or interrupted power conditions, thereby assuring that the data is preserved during the error condition.

Figure 5:
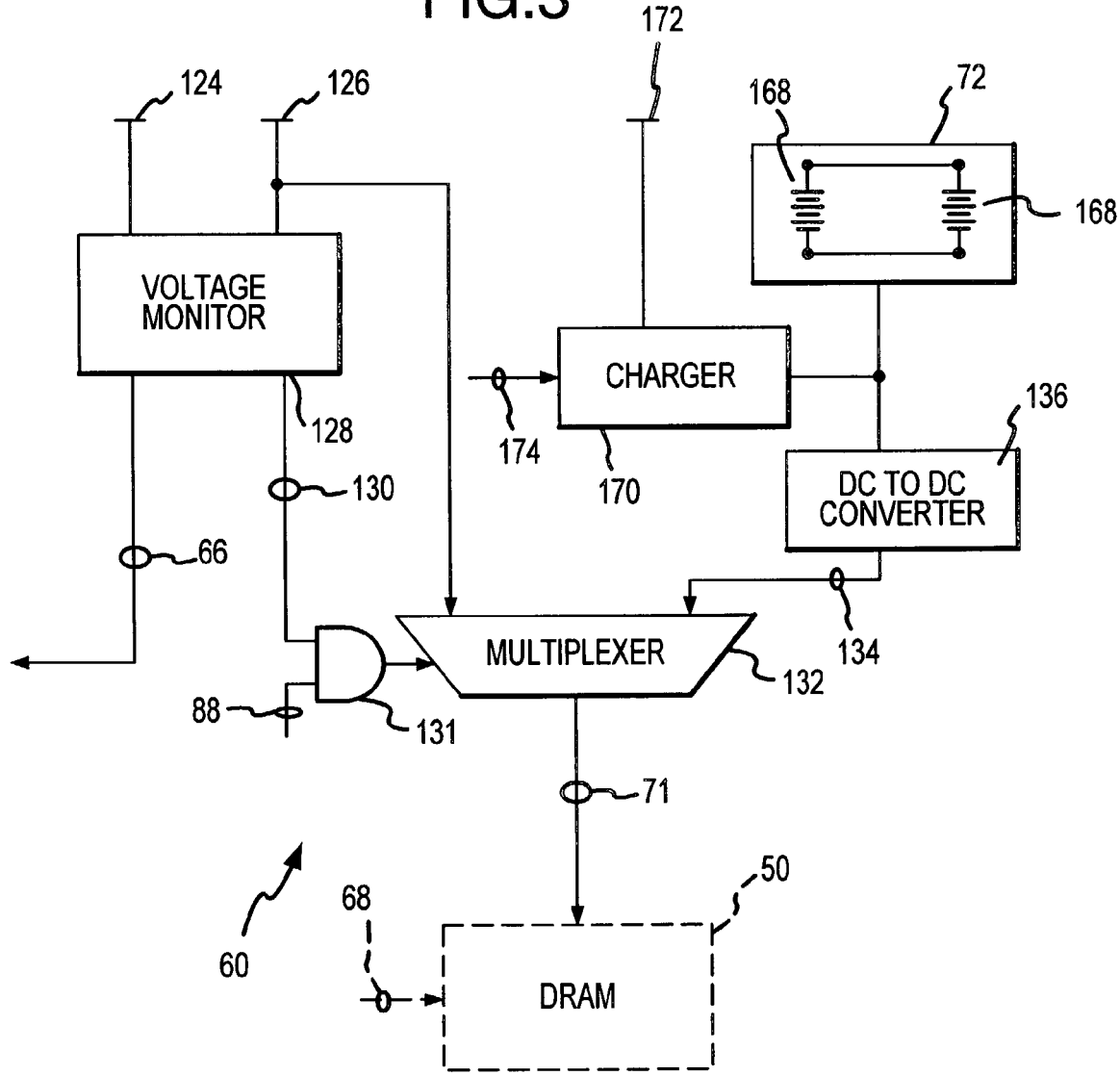
FIG. 5 is a simplified block diagram of a power monitor and selector of the memory shown in the FIG. 2.
Figure 6:
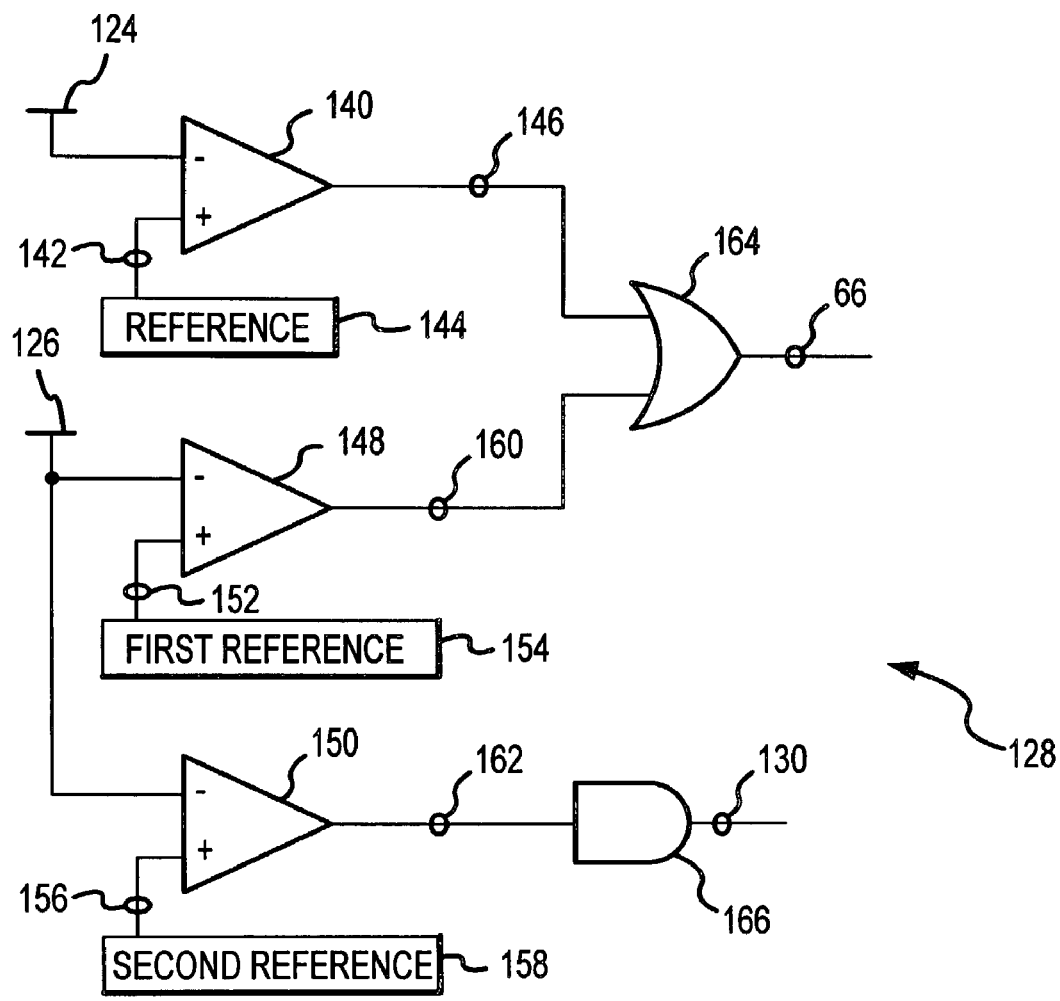
FIG. 6 is a generalized logic diagram illustrating the functionality of a voltage monitor shown in FIG. 5.

More details concerning the power monitor and selector 60 are shown in FIGS. 5 and 6. The power monitor and selector 60 monitors two internal voltages 124 and 126 of the main internal power supply 70 (FIG. 2), connects the auxiliary power supply 72 (FIG. 2) to the DRAM 50 under conditions when either or both of the internal voltages 124 and 126 diminish, and periodically charges the auxiliary power supply 72 to maintain it in a fully charged state. While the internal voltages 124 and 126 are sufficient and indicative of normal functionality, the DRAM 50 is powered by the main internal power supply 70. If either of the internal voltages 124 and 126 drop below predetermined minimum thresholds, thereby indicating a potential malfunction in a power supply within the computer system or a disruption or reduction in voltage from the conventional AC power mains, power for the DRAM 50 is switched to the auxiliary power supply 72. The auxiliary power supply 72 is periodically charged during normal operation, when the voltages 124 and 126 are within normal limits.

The power monitor and selector 60 includes a voltage monitor 128 which senses the level of two internal voltages 124 and 126. The internal voltage 124 is the main DC power supplied throughout the computer system. The other internal voltage 126 is the DC power supplied to the volatile memories and the logic circuits within the computer system. The voltage 126 primarily powers the DRAM 50. Conventional power supply converters (not shown) convert conventional AC power applied to the computer system into the voltages 124 and 126. For example, the main internal voltage 124 may be approximately 5 volts and the logic voltage may be approximately 3.3 volts.

A failure or reduction in the main AC power supplied to the computer system will be reflected in a diminishing value of the voltages 124 and 126. Neither voltage 124 nor voltage 126 will immediately terminate with an AC mains power interruption or reduction, because of the normal internal capacity of the internal power supplies. However, the decay of the voltages 124 and 126 will begin immediately and will reduce in a relatively short time. Monitoring the stability of the voltages 124 and 126 in effect monitors the proper level and stability of the AC mains power supplied to the computer system and will also detect a condition where one of the internal power supplies within the computer system fails or malfunctions. Upon detecting a condition where one of the internal voltages 124 or 126 falls below a predetermined threshold, the voltage monitor 128 delivers the low voltage warning signal 66 to the error condition logic 56 (FIG. 2).

The voltage monitor 128, shown in FIG. 5, supplies a power selection signal 130 to a multiplexer 132. The multiplexer 132 is a conventional two-input device. One input is from the internal logic voltage 126. The other input is a voltage 134 from a DC to DC power converter 136. One logical state of the power selection signal 130 causes the internal logic voltage 126 to be supplied on the power conductor 71 from the output terminal of the multiplexer 132, and the other logical state of the power selection signal 130 causes the voltage 134 to be supplied on the power conductor 71 from the output terminal of the multiplexer 132. Under normal conditions, the voltage monitor 128 supplies the power selection signal 130 in one logical state, for example a logical low level, which causes the multiplexer 132 to supply the internal logic voltage 126 to power the DRAM 50. Under abnormal conditions of a diminished voltage 124 or 126, the voltage monitor 128 supplies the power selection signal 130 in the other logical state, for example a logical high level, causing the multiplexer 132 to supply the voltage 134 to power the DRAM 50.

The auxiliary power enable signal 88 (FIG. 2) permits the power selection signal 30 to have the described effect on the multiplexer 132. The auxiliary power enable signal 88 is applied to a logic AND gate 131. The presence of the signal 88 is required for the power selection signal 130 to influence the multiplexer 132. The logical level of the auxiliary power enable signal 88 is coordinated with the logical level of the power selection signal 130 from the voltage monitor 128, so that the assertion of the signal 88 is necessary for the power selection signal 130 to cause the multiplexer 132 to selectively apply the power at 126 or the power at 134 to the power conductor 71. For example, a high logical level of signal 88 and a high logical level of signal 130 will result in the multiplexer 132 applying the voltage at 134 from the auxiliary power supply 72 to the DRAM 50. If the auxiliary power enable signal 88 is not asserted, and is therefore at a logical low level for example, the power selection signal 130 will have no effect on the multiplexer 132 and the logic level voltage 126 will connected to the DRAM 50, even under conditions when the logic level voltage 126 diminishes or is interrupted.

The DC to DC converter 136 converts the level of the voltage from the auxiliary power supply 72 to the voltage level 134 which is sufficient to power the DRAM 50. Depending upon the characteristics of the DRAM 50 and the normal output voltage of the auxiliary power supply 72, the DC to DC converter 136 may not be required. The DC to DC converter 136 is conventional.

The voltage monitor 128 is preferably a conventional multi-voltage monitor, having the functionality represented in FIG. 6. The main internal voltage 124 is supplied to a negative input terminal of a comparator 140. The positive input terminal of the comparator 140 receives a signal 142 from a main internal reference 144. The analog level of the signal 142 from the main internal reference 144 represents the minimum amount of voltage to which the main internal voltage 124 is permitted to decrease before a low voltage condition is indicated. So long as the main internal voltage 124 remains above the level of the main internal reference signal 142, the comparator 140 supplies a low level output signal 146. The low level output signal 146 represents the presence of normal voltage conditions. Should the main internal voltage 124 decrease below the level of the main internal reference signal 142, the comparator 140 supplies a high level output signal 146. The high level output signal 146 signifies the presence of an error or malfunction condition in which the main internal voltage 124 decreases below an acceptable level represented by the main internal reference 144. For example, the analog level of the main internal reference signal 142 may be five percent less than the normal operating level of the main internal voltage 124.

The internal logic voltage 126 is supplied to the negative input terminals of comparators 148 and 150. A signal 152 from a first reference 154 and a signal 156 from a second reference 158 are supplied to the positive input terminals of the comparators 148 and 150, respectively. The analog level of the first reference signal 152 represents the minimum voltage to which the logic voltage 126 is permitted to decrease before an abnormal low logic voltage error condition is indicated. For example, the level of the first reference signal 152 may be five percent less than the normal operating level of the logic voltage 126. The analog level of the second reference signal 156 is less than the analog level of the first reference signal 152. The second reference signal 156 thereby represents a lesser voltage than an abnormal low logic voltage level. For example, the level of the second reference signal 156 may be ten percent less than the normal logic voltage 126 and approximately five percent less than the first reference signal 152.

So long as the internal logic voltage 126 remains above the level of the first and second reference signals 152 and 156, the comparators 148 and 150 supply low level output signals 160 and 162, respectively. The low level output signals 160 and 162 represent the presence of normal logic voltage. Should the logic voltage 126 decrease below the level of the first reference signal 152 but remain above the level of the second reference signal 156, the comparator 148 supplies a high level output signal 160 while the comparator 150 supplies a low level output signal 162. In this condition, the high level output signal 160 signifies the occurrence of the error condition of the logic voltage 126 decreasing below an acceptable level represented by the first reference 154. As the logic voltage 126 continues to decrease below the level of the second reference signal 156, the comparator 150 supplies the high level output signal 162 after the time that the comparator 138 has supplied the high level output signal 160.

The output signals 146 and 160 are applied to the input terminals of a logic OR gate 164. Upon the first occurrence of a high level of one of the signals 146 or 160, the OR gate 164 supplies the low voltage warning signal 66. As described above, the low voltage warning signal 66 is supplied to the error condition logic 66 (FIG. 2) where the assertion of the low voltage warning signal 66 results in the delivery of the self-refresh enable signal 68 to the DRAM 50. Consequently, upon either the main internal voltage 124 or at the internal logic voltage 126 decreasing to an abnormal level, the low voltage warning signal 66 will be delivered by the OR gate 164 to the error condition logic 56.

As the internal voltages continue to decrease, and at a later time established by the rate of decrease of the internal logic voltage 126 and by the level of the second reference signal 156 relative to the first reference signal 152, the comparator 150 delivers the high output signal 162. The high output signal 162 is applied to a buffer 166 and the output of the buffer 166 is the power selection signal 130. As described above, the power selection signal 130 controls the multiplexer 132 (FIG. 5) to deliver either the logic level voltage 126 or the auxiliary power supply-derived voltage 132 for powering the DRAM 50. By delaying the application of the power selection signal 130 as a result of using the second reference signal 146 which is less than the first reference signal 142, the DRAM 50 is placed into the self-refresh mode before power from the auxiliary power supply 72 (FIG. 2) is applied to it. Consequently, the DRAM 50 stabilizes in the self-refresh mode of operation before the auxiliary power is switched to it. Placing the DRAM 50 in the self-refresh mode before switching to the power from the auxiliary power supply 72 avoids consuming power from the auxiliary power supply before it is needed and also avoids the possibility of inadvertently disabling the self-refresh mode of operation of the DRAM 50 if the auxiliary power application and the self-refresh mode were initiated at the same time.

The auxiliary power supply 72 is preferably formed by at least one rechargeable battery, and preferably a plurality of individual rechargeable batteries, such as lithium ion battery cells 168. The individual battery cells 168 are electrically connected in parallel, as shown in FIG. 5. The parallel connection of the battery cells 168 provides increased capacity for powering the DRAM 50, and also provide redundancy if one individual lithium lion battery cell 168 should fail. Selecting lithium ion battery cells 168 for use as the auxiliary power supply 72 makes it possible to obtain redundancy. Lithium ion batteries have the inherent characteristic of failing in an open circuit condition. Should one of the cells 168 fail, its open circuit condition will permit the other parallel-connected cell 168 to continue to supply power. Using multiple lithium ion battery cells connected in parallel eliminates a single cell failure as a failure condition which would result in loss of data within the DRAM 50. The redundancy of the multiple lithium ion cells 168 is therefore important in contributing to the reliable maintenance of the data within the DRAM 50.

Lithium ion cells 168 exhibit a relatively long usable lifetime and a relatively high power density. Two typical, two parallel-connected lithium ion cells permit adequate power to maintain data within the DRAM 50 for approximately five to seven days when the DRAM 50 is in the low-power, self-refresh mode.

The power monitor and selector 60, shown in FIG. 5, includes a conventional charger 170 to keep the rechargeable batteries of the auxiliary power supply 72 in a fully charged condition when conventional AC power is available to the computer system. A source 172 of charging voltage is delivered to the charger 170. The charging voltage source 172 is derived from conventional AC power supplied to the computer system. The charger 170 converts the power from the source 172 into voltage and current levels which are suitable for charging the batteries of the auxiliary power supply 72.

A CPU (not shown) which is preferably integrated within the memory controller 52 (FIG. 2) periodically delivers a charger enable signal 174 to the charger 170. The times of application and duration of the charger enable signals 174 are determined in accordance with the recharging characteristics of battery cells and a charging program which is executed by the integral CPU of the memory controller. Executing the charging program maintains the best longevity and maximum voltage capacity from the auxiliary power supply 72, to sustain data in the DRAM 50 for the maximum amount of time permitted by the battery cells 168.

Although not shown in FIG. 5, the power monitor and selector 60 also includes conventional voltage sensors (not shown) to monitor the voltage across the battery cells 168. Signals from these voltage sensors are also supplied to the integral CPU of the memory controller 52. By using the voltage cell sensing signals, overcharging and over-discharging the cells 168 is avoided to maintain maximum longevity of those cells.

The power monitor and selector 60 has been described as monitoring two voltages 124 and 126. Monitoring these two voltages illustrates the capability of monitoring a plurality of internal voltages within a computer system. Under such circumstances the low voltage warning signal could be generated upon any of the internal voltages falling below a predetermined threshold. However auxiliary power would only be connected to power the DRAM upon the voltage which normally powers the DRAM falling below its predetermined threshold.

More details concerning the bus clock generator 58 and its role in detecting the loss of the bus clock signal 76 (FIG. 2), are shown in FIGS. 7, 8A, 8B, 8C, 8D, 8E, 8F, 8G, and 8H. The bus clock generator 58 is connected to one of the bus conductors 54 (FIG. 2) from which it receives the bus clock signal 76 from the expansion bus 28 (FIG. 1). As shown in FIG. 7, the bus clock generator circuit 58 comprises a phase locked loop oscillator 175 and a bus clock absence detection circuit 176. The bus clock signal 76 is applied to both the phase locked loop oscillator 175 and the bus clock absence detection circuit 176.

Figure 3:
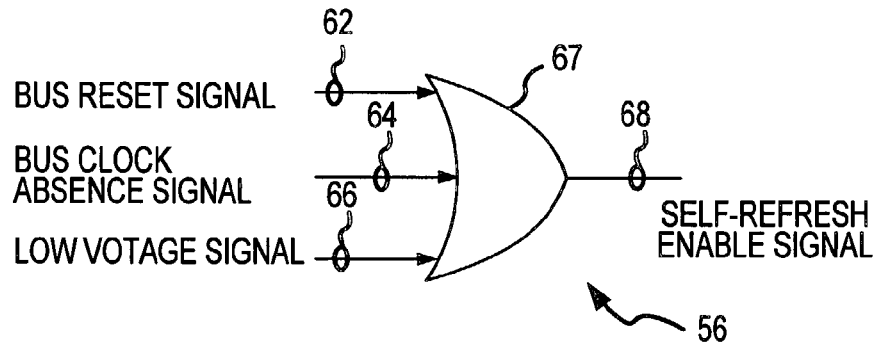
FIG. 3 is a logic representation of the functionality of an error condition logic circuit of the memory shown in FIG. 2.

The primary function of the phase locked loop oscillator 175 is to replicate the bus clock signal 76 with a surrogate bus clock signal 78 that has pulses exhibiting essentially no or zero phase shift or delay compared to the pulses of the bus clock signal 76. The output signal 78 supplied by the phase locked loop oscillator 175 is the surrogate for the bus clock signal 76. The surrogate bus clock signal 78 is used by the memory controller 52 (FIG. 2) in exactly the same manner as the bus clock signal 76 would normally be used. Because the surrogate bus clock signal 78 is essentially identical in timing to the bus clock signal 76, the memory controller 52 (FIG. 2) functions exactly as it would in response to the bus clock signal 76, as long as the bus clock signal 76 is present on the expansion bus 28 (FIG. 1). However, should the bus clock signal 76 terminate, the bus clock absence detection circuit 176 recognizes the absence of the bus clock signal and supplies the bus clock absence signal 64 (FIGS. 2 and 3). Moreover, even though the bus clock signal 76 has ceased pulsing or oscillating between opposite digital logic states, the phase locked loop oscillator circuit 175 continues to generate the surrogate bus clock signal 78 for a sufficient time after the termination of the bus clock signal 76 to permit the memory controller 52 (FIG. 2) to complete any pending memory transactions necessary to assure that the data is written completely to the DRAM. With the data written completely to the DRAM, that data will be preserved by placing the DRAM in the safe state.

The phase locked loop oscillator 175 is a conventional circuit, sometimes also called a zero delay buffer. The circuit 175 includes a conventional oscillator 177 to which the bus clock signal 76 is applied. An output signal from the oscillator 177 is applied to a selectable delay circuit 178. The circuit 178 delays the output signal from the oscillator 177 by a predetermined selectable amount of time and applies a delayed signal 179 as feedback to the oscillator 174. The delayed feedback signal 179 adjusts until the output signal from the oscillator 177 is matched or synchronized to the frequency of the bus clock signal 76. With the output frequency of the oscillator 177 synchronized to the bus clock signal 76, the selectable delay circuit 178 supplies an output signal which is essentially identical in phase to the bus clock input signal 76. The output signal from the selectable delay circuit 178 forms the surrogate bus clock signal 78. The zero delay or zero phase shift between the primary input bus clock signal 76 and the surrogate bus clock signal 78, as created by the phase locked loop oscillator 175, is illustrated in FIGS. 8A and 8B.

The selectable delay circuit 178 of the phase locked loop oscillator 175 includes reactive energy storage elements, such as capacitors, to establish the timing of the delayed feedback signal 179. Moreover, for the oscillator 174 to lock into synchronization with the input bus clock signal 76, it is frequently the case that a multiple number of complete cycles of the input signal 76 must occur before the synchronization is established. These conditions will cause the phase locked loop oscillator 175 to continue oscillating for some period of time after the termination of the input bus clock signal 76. Consequently, the surrogate bus clock signal 78, which is the output signal from the phase locked loop oscillator 175, will continue to oscillate between opposite digital logic levels or deliver pulses for some amount of time after that time point 180 where the bus clock signal 76 ceases pulsing, as shown in FIG. 8A. The continuance of the surrogate bus clock signal 78 beyond the time point 180, as shown in FIG. 8B, is sufficient to generate enough surrogate bus clock cycles to cause the memory controller 52 to complete any pending write transactions to the DRAM 50 (FIG. 2).

The bus clock absence detection circuit 176 receives the bus clock signal 76 and the surrogate bus clock signal 78 as input signals, and from those signals 76 and 78, recognizes when the bus clock signal 76 has terminated. Under those circumstances, the detection circuit 176 delivers the bus clock absence signal 64. To perform these functions, the bus clock signal 76 is applied to the clocking input of a D-type flip-flop 182. The not Q output of the flip-flop 182 is connected to the normal input terminal of the flip-flop 182 to cause an output signal at 184 from the Q output terminal of the flip-flop 182 to change states with each applied pulse of the bus clock signal 76. In essence, the flip-flop 182 divides the number of pulses of the bus clock signal 76 by two as a result of the feedback from its not Q terminal to its input terminal.

The functionality of the flip-flop 182 is illustrated by FIGS. 8A, 8C and 8D. The output signal 184 from the flip-flop 182 at the Q terminal is shown in FIG. 8C, and the inversion of signal 184 from the not Q output terminal is shown in FIG. 8D by signal 186. With each rising edge of the bus clock signal 76, the state of the not Q signal 186 at that time becomes the state of the Q signal 184, after the propagation delay of the flip-flop 182. The transition of output states of the flip-flop 182 consume a slight amount of propagation time, so the change in states of the flip-flop 182, as shown by signals 184 and 186 (FIGS. 8C and 8D), is slightly delayed relative to the phase of the bus clock signal 76 shown in FIG. 8A.

The Q output signal 184 from the flip-flop 182 is applied to the input terminal of a second D-type flip-flop 188 and to one input terminal of a logic exclusive OR gate 190. The surrogate bus clock signal 78 is applied to the clock terminal of the flip-flop 188. Because the surrogate bus clock signal 78 has essentially the same timing as the bus clock signal 76 (see FIGS. 8A and 8B), an output signal 192 from the flip-flop 188 at its Q terminal changes to the opposite state of the signal 184, while retaining essentially the same frequency as the signal 184. The fact that the flip-flop 188 produces an inverted signal 192 relative to the signal 184 can be understood by observing the relationship between the surrogate bus clock signal 78 shown in FIG. 8B and the state of the signal 184 shown in FIG. 8C, taking into consideration the propagation delay of the flip-flop 188. The propagation delay of the flip-flop 188 is essentially the same as the propagation delay of the flip-flop 182, causing the signal 192 to have essentially the same delay as the signal 184, relative to a leading edge of either of the signals 76 or 78. The inverted relationship of the output signal 192 from the Q terminal of the flip-flop 188 and the output signal 184 from the Q terminal of the flip-flop 182 can be understood by comparing FIGS. 8C and 8E.

The exclusive OR gate 190 delivers a high level output signal 194 whenever its input signals 184 and 192 occupy different logical states. When both input signals 184 and 192 occupy the same logical state, either a logical high or logical low level, the output signal 194 from the exclusive OR gate 190 is a logical low level. Because the signals 184 and 192 are relative inversions of each other, they will always occupy mutually opposite logical states so long as the bus clock signal 76 is present and causing the flip-flop 182 to function as described. This relationship is illustrated by comparing signals 184 and 192 shown in FIGS. 8C and 8E prior to the time point 180 before the bus clock signal 76 ceases. Prior to time point 180, the bus clock signal 76 is present and oscillating between its logical high and low states in the normal fashion. Under these circumstances, the output signal 194 from the exclusive OR gate 190 remains high as a result of the mutual inverted relationship of its two input signals 184 and 192.

After time point 180, the absence of the primary bus clock signal 76 causes the flip-flop 182 to maintain the state of the signal 184 which existed when the bus clock signal 76 terminated, while the continuing surrogate bus clock signal 78 causes the flip-flop 188 to change the level of its output signal 192. The signal 192 changes to the same state as the state of the signal 184. The exclusive OR gate 190 recognizes two input signals of the same logical state, and transitions the output signal 194 from a logical high state to a logical low state shortly after the time point 180. This relationship and functionality are illustrated by the levels of the signals 184, 192 and 194 shown in FIGS. 8C, 8E and 8F, respectively.

The output signal 194 from the exclusive OR gate 190 is applied to the input terminal of a third D-type flip-flop 196. The flip-flop 196 is clocked by the surrogate bus clock signal 78. The logical output level of the signal 194 from the exclusive OR gate 190 is clocked to the output Q terminal of the flip-flop 196 as signal 198 upon the next occurrence of a pulse from the surrogate bus clock signal 78. The Q terminal output signal 198 is essentially latched into the flip-flop 196 by the surrogate bus clock signal 78. The signal 198 is inverted by an inverter 199, and becomes the bus clock absence signal 64. The functionality of the flip-flop 196, as clocked by the surrogate bus clock signal 78, is understood by comparing signals 78, 194 and 198 as shown in FIGS. 8B, 8F and 8G, respectively. The functionality of the inverter 199 is understood by comparing FIGS. 8G and 8H.

In the manner described, the phase locked loop oscillator 175 of the bus clock generator circuit 58 continues to generate pulses of the surrogate bus clock signal 78 after and if the primary bus clock signal 76 ceases. The bus clock absence signal 64 is asserted within a few cycles after the absence of the primary bus clock signal 76. The surrogate bus clock signal 78 and the bus clock absence signal 64 are used by the memory controller 52 (FIG. 2) to complete any memory write transaction to the DRAM 50, thereby assuring that data is written to the DRAM so that it can be preserved in response to error conditions. However, during normal operation when the bus clock signal 76 is present, the surrogate bus clock signal 78 serves as an identical replacement for the primary bus clock signal, and the bus clock absence signal 64 is not asserted.

Figure 9:
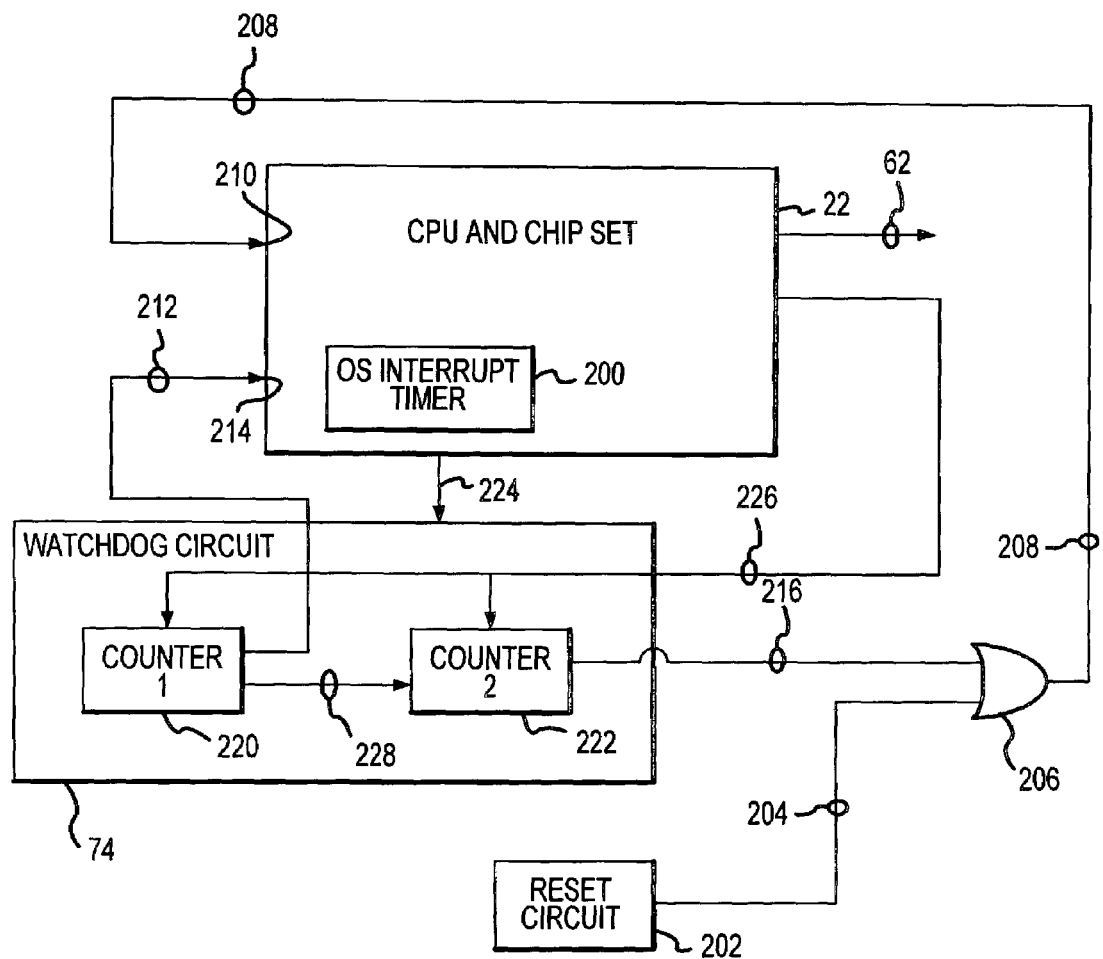
FIG. 9 is a block diagram of prior art watchdog circuit incorporated in a host central processing unit (CPU) of the computer system shown in FIG. 1.
Figure 10:
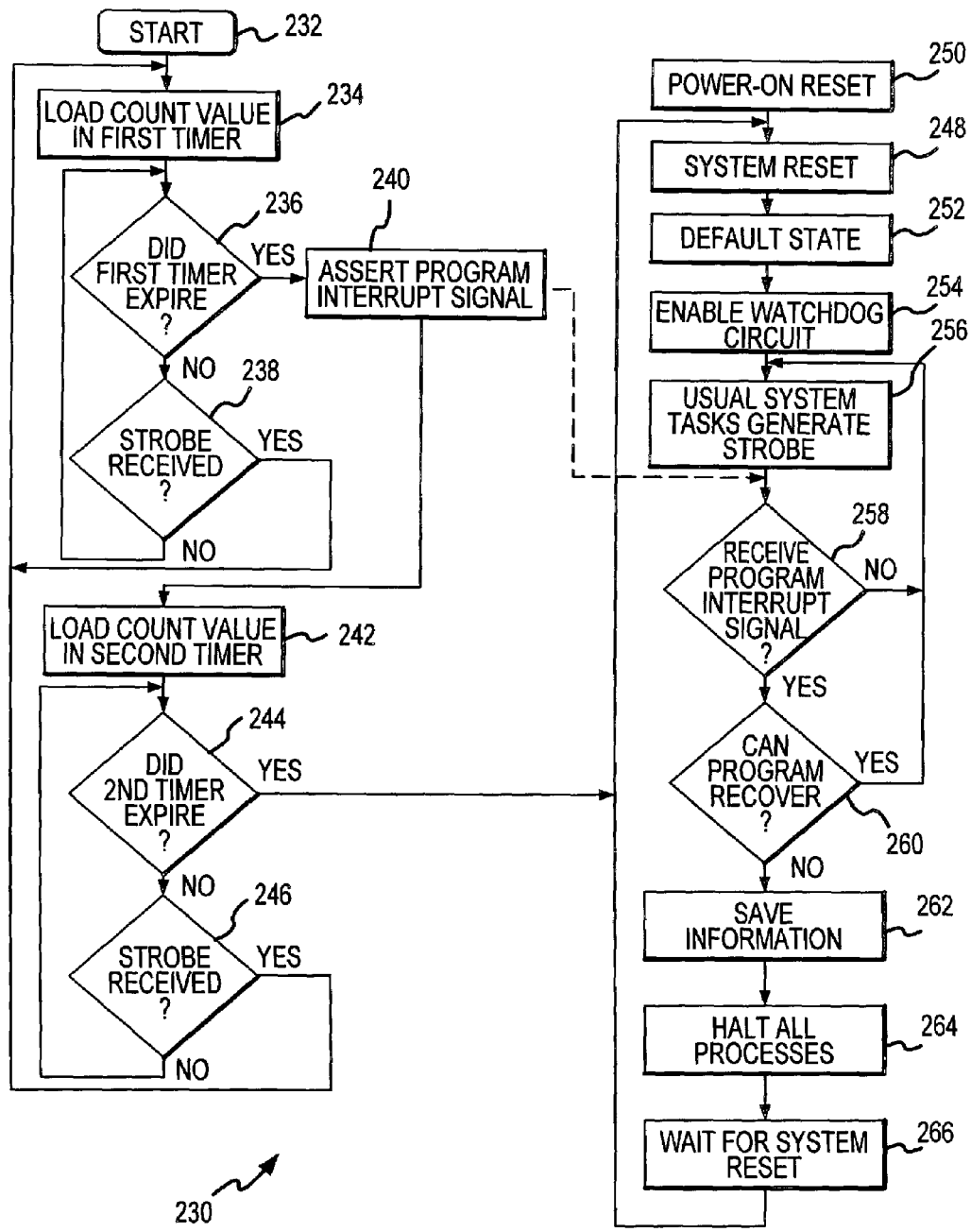
FIG. 10 is a flow chart of prior art functions executed by the watchdog circuit and the host CPU shown in FIG. 9.

More details concerning the nature and function of a preferred prior art watchdog circuit 74 (FIG. 1) which asserts the bus reset signal 62 (FIGS. 2 and 3) are described in conjunction with FIGS. 9 and 10. The watchdog circuit 74 is incorporated in the host CPU 22 and its associated conventional chipset of the computer system 20 (FIG. 1). The functionality of the watchdog circuit 74 is also partially embodied in the operating system (OS) for the computer system 20. When the computer system 20 is used as a mass storage appliance, the OS is the MSOS as described above.

A conventional OS interrupt timer 200 is a part of the CPU 22. The OS interrupt timer 200 generates the normal OS interrupt signals on regular intervals, for example once each millisecond. The OS is responsible for generating the normal OS interrupt signals, and the OS interacts with the timer 200 to do so. The applications, programs and tasks which are being executed by the CPU 22 (hereinafter collectively "tasks") respond to the normal OS interrupt signals generated by the OS interrupt timer 200 to assure their normal functionality. During the time interval between normal OS interrupt signals, the execution of the task should complete. If the task has not completed execution during the time interval between normal OS interrupt signal intervals, the OS interrupt signal will interrupt its further execution. Interrupting the task in this matter permits attempts at further execution and attempts to correct any unintended suspended functionality without disabling, "hanging up" or "hanging" the entire computer system.

Some types of tasks should not be interrupted once their execution commences. Other types of tasks require more time to complete than the time interval between the normal OS interrupt signals. In both of these situations, the normal generation of OS interrupt signals is suspended to provide enough time for the uninterruptible or lengthy task to complete. Once execution has completed, the generation of normal OS interrupt signals resumes.

Suspending the normal generation of the OS interrupt signals is an acceptable technique for executing uninterruptible or lengthy tasks, but it does not provide a way for the host CPU 22 to recover or continue functioning if an unanticipated suspension or hung condition occurs during suspension of the OS interrupt signals. If an unanticipated suspension of hung condition occurs, the OS interrupt timer 200 will not generate normal OS interrupt signals because its functionality has been suspended. The hung uninterruptible or lengthy task will not release control, so the entire computer system 20 remains in an unintentionally suspended or hung state.

The watchdog circuit 74 monitors the normal occurrence of the OS interrupt signals and detects the cessation of executing forwardly-progressive instructions of those programed instructions which constitute a task. So long as the OS interrupt signals occur within a predetermined time, the watchdog circuit has no effect on the normal operation of the computer system. However, if the watchdog circuit does not detect the normal occurrence of the OS interrupt signal within a predetermined time after which it would have normally occurred, the watchdog circuit asserts the bus reset signal 62 (FIGS. 2 and 3), which results in resetting the entire computer system 20. Usually the expired time interval at which the watchdog circuit 74 causes the computer system to reset is substantially greater than the time interval between normal OS interrupt signals. This longer time interval provides an opportunity for the currently-executing task to complete execution, or to recover from a hung or suspended condition, and to recover any data that has been processed, before the bus reset signal is asserted to reset the entire computer system. The watchdog circuit also establishes an additional level or priority of OS interrupts, between the normal OS interrupt and resetting the entire computer system, thereby providing an additional opportunity to recover from an unintended suspension or hung condition during execution of an uninterruptible task.

The typical way to force the computer system 20 out of a hung state is to selectively reset or power-cycle the entire system by activating a conventional reset circuit 202. Upon activation, the reset circuit 202 delivers a signal 204 which is conducted through a conventional OR gate 206 as a system reset signal 208 to a system reset terminal 210 of the CPU 22. In response to the system reset signal 208, the CPU 22 delivers the bus reset signal 62 and then resets to a known initial state, ready to execute tasks.

The watchdog circuit 74, in conjunction with the other features of the present invention, prevent the loss of any data or work in progress associated with the execution of an uninterruptible or lengthy task, when an unintended suspension or hung condition is encountered. The watchdog circuit 74 also provides an opportunity for the uninterruptible or lengthy task to recover from such an unexpected suspension or hung condition without the necessity to reset the entire computer system 20. In order to accomplish these and other functions, the watchdog circuit 74 delivers a program interrupt signal at 212 to a program interrupt terminal 214 of the CPU 22, under the conditions described below.

The program interrupt terminal 212 is monitored by the OS. Upon sensing the program interrupt signal 212, the OS attempts to save the work in progress and the data executed to the point where the unanticipated suspension or hang up occurred. By saving the work in progress and the data under execution, it is possible to troubleshoot the cause of the hang up, or to continue executing the program at a later time using the saved data and work in progress. Moreover, saving this data and the work in progress to a volatile memory which is placed in a safe state preserves that data and work in progress in accordance with the present invention.

If the OS is unable to correct the problem which caused the hung condition within a time after the delivery of the program interrupt signal 212, the watchdog circuit 74 will deliver a watchdog reset signal 216. The watchdog reset signal 216 is applied to the OR gate 206 and is conducted through it to become the system reset signal 208 applied to the system reset terminal 210. The system reset signal 208 causes the entire computer system 20 to reset, thereby terminating any execution of the uninterruptible or lengthy task. After resetting, the OS is available again to execute the various tasks. Resetting makes the computer system functional again.

The watchdog reset signal 216 is delivered after the expiration of a predetermined time after the program interrupt signal 212 is delivered. The amount of time between the delivery of the system reset signal 216 and the program interrupt signal 212 provides sufficient time for the OS to attempt to recover the work in progress and other previously-processed data to preserve it by placing the volatile memory in the safe state, before the entire computer system is reset.

The watchdog circuit 74 includes a first timer 220 and a second timer 222. The timers 220 and 222 interact with the OS executing on the CPU 22. Count values are loaded into each of the timers 220 and 222 over conductors 224 which connect the watchdog circuit 74 to the CPU 22. The timers 220 and 222 also receive a "pet" or strobe signal 226 which is supplied from the CPU 22 on a periodic basis. The first timer 220 of the watchdog circuit 74 supplies the program interrupt signal 212 to the program interrupt terminal 28, and a second timer 222 of the watchdog circuit 74 supplies the watchdog reset signal 216 to create the system reset signal 208.

The count value which is loaded into the timer 220 over the conductors 224 establishes the predetermined time at which the program interrupt signal 212 is delivered from the watchdog circuit 74, after the time when the normal OS interrupt signal from the timer 200 has been suspended. The count value loaded into the timer 222 over the conductors 224 establishes the predetermined time at which the watchdog reset signal 216 is delivered from the watchdog circuit 74, after the time when the program interrupt signal 212 has been delivered by the watchdog circuit 74. The second timer 222 commences timing based on its loaded count value upon the receipt of an enable signal 228 delivered from the first timer 220 at the time that the first timer delivers the program interrupt signal 212. The count value set into the timer 220 represents a time interval which is sufficient to normally and completely execute an uninterruptible or lengthy task. Alternatively, the first and second timers 220 and 222 both begin counting simultaneously, based on the different count values loaded individually into each of those timers. The count value loaded into the second timer 222 results in the second timer counting a relatively longer time period before it delivers the watchdog reset signal 216, compared to the relatively shorter time period counted by the first timer 220. In both cases, the watchdog reset signal 216 is delivered a predetermined time after the program interrupt signal 212 is delivered.

If the uninterruptible or lengthy task has not been completely executed by the time when the first timer 220 delivers the program interrupt signal 212, an unintentionally suspended or hung condition has occurred. Delivery of the program interrupt signal 212 under these conditions allows the OS to attempt to correct the error condition. If correction does occur, a resumption of the delivery of the strobe signal 226 to the timers 220 and 222 occurs. In response to the strobe signal 226, the timers 220 and 222 are reset and again begin counting anew. So long as strobe signals 226 are delivered in regular order, the timers 220 and 222 never reach the point where the program interrupt signal 212 and the watchdog reset signal 216 are delivered.

On the other hand, if the delivery of the program interrupt signal 212 does not result in the subsequent generation of a strobe signal 226, the second timer 222 will continue to count and will deliver the watchdog reset signal 216 when its count value has been reached. Delivery of the program interrupt signal 212 signals the OS to attempt to make corrections, and also to save the data and work in progress. The time period after delivering the program interrupt signal 212 and before the watchdog reset signal 216 is delivered by the timer 222, provides a sufficient time opportunity for the OS to attempt corrections and to save the work in progress and data. If the OS is unable to make corrections during the time period established by the timer 222 after the program interrupt signal 212 is delivered, it is presumed that a major error has occurred from which there can be no recovery short of resetting the entire computer system. Under those circumstances, the timer 222 delivers the watchdog reset signal 216 which, after having been conducted through the OR gate 206, becomes the system reset signal 208. The system reset signal 208 causes the bus reset signal 62 to be delivered to the other components of the computer system connected to the bus 28 (FIG. 1), thereby resetting the entire computer system.

The strobe signal 226 is supplied from the CPU 22 in response to the occurrence of an interval equal to a predetermined multiple number of normal OS interrupt signals established by the OS interrupt timer 200. The number of normal OS interrupt signal intervals occur before a strobe signal 226 is supplied should provide a reasonable time opportunity for the OS to undertake normal corrective activity, if the hung condition should occur during normal execution. Generating the strobe signal 226 only after a multiple number of normal OS interrupt signals have otherwise been generated assures that the strobe signals 226 will result primarily from a circumstance where the generation of the normal OS interrupt signals have been suspended as a result of executing an uninterruptible or lengthy task.

The time period before delivery of the program interrupt signal 212 should be sufficiently long to accommodate the normal time required to complete the uninterruptible or lengthy task which caused the suspension of the delivery of the normal OS interrupt signals, but not so long as to unduly hang the entire computer system before corrective action is attempted. The time interval after the delivery of the program interrupt signal 212 and before the delivery of the watchdog reset signal 216 should be sufficiently long to provide an adequate opportunity for the OS to attempt to correct itself and to save the data and work in progress. Generally speaking, the time interval before delivering the program interrupt signal 212 will be significantly longer than the time interval which occurs before the watchdog reset signal 216 is delivered after the program interrupt signal 212.

As an example of the relative timing of the various signals, the normal OS interrupt signal generated by the timer 200 may occur once each millisecond; the strobe signal 226 may occur after the time interval of ten normal OS interrupt signals, i.e. once each 10 milliseconds; the count value loaded into the first timer 220 will cause it to deliver the program interrupt signal 212 at approximately 1.5 seconds after the first timer starts counting; and the value loaded into the second timer 222 will cause it to deliver the watchdog reset signal 216 approximately 500 milliseconds after the first timer 220 delivers the program interrupt signal 212 and enables the second timer 222 with the enable signal 228.

The functionality of the watchdog circuit 74, the CPU 22 and the OS, is illustrated by the process flow 230 shown in FIG. 10. Individual functions in the process flow are identified by separate reference numbers. The process flow 230 begins at 232, where the functionality of the watchdog circuit is invoked before the execution of any potentially uninterruptible or lengthy task. At 234, the count value is loaded into the first counter 220 over the conductors 224 (FIG. 9). The first counter 220 (FIG. 9) begins timing the interval established by the count value.

A determination occurs at 236 as to whether the first timer has expired. Until the determination at 236 is affirmative, the process flow moves from 236 to 238. At 238 it is determined whether a strobe signal 226 (FIG. 9) has been delivered to the first timer. So long as the determination at 238 is negative, the process flow continues in a loop where the determinations at 236 and 238 are repeatedly made. If a strobe signal is received as determined at 238, which would occur during normal execution of the uninterruptible or lengthy task, the process flow moves from 238 back to 234, thereby preventing the watchdog circuit 74 from delivering the program interrupt signal 212 (FIG. 9). On the other hand, if the first timer expires as determined at 236 without receiving a strobe signal as determined at 238, the program flow advances from 236 to 240.

At 240, the program interrupt signal 212 is supplied by the first timer 220 (FIG. 9). Next at 242, the count value is loaded into the second timer 222 (FIG. 9), and the second timer begins timing its interval, in one case. In another case, the count value is loaded in the second timer simultaneously with the count value being loaded into the first timer at 234. In the second case, the process flow 230 moves from asserting program interrupt signal at 240 directly to the determination at 244. In the first case, a determination occurs as to whether the second timer has expired. Until the determination at 244 is affirmative, the process flow moves from 244 to 246. A determination is made at 246 of whether a strobe signal 226 (FIG. 9) has been delivered to the second timer. So long as the determination at 246 is negative, the process flow loops between 246 and 244 while the determinations at 244 and 246 are made. If a strobe signal 226 (FIG. 9) is received as determined at 246, which would occur as a result of the OS accomplishing corrective action and resuming normal functionality, the process flow 230 moves from 246 back to 234. On the other hand, if the second timer 222 (FIG. 9) expires as determined at 244 without receiving a strobe signal as determined at 246, the program flow advances from 244 to 248.

At 248, the system reset signal 208 is asserted to the CPU 22, as a result of the second timer 222 supplying the watchdog reset signal 216 to the OR gate 22 (FIG. 9). The system reset at 248 causes the bus reset signal 62 (FIGS. 2, 3 and 9) to be asserted and thereafter the entire computer system is reset. The computer system may also be reset at 248 as a result of the power cycle causing a power-on reset shown at 250.

As a result of the resetting occurring at 248, the watchdog functionality is placed into a default state as shown at 252. Thereafter, the watchdog circuit is enabled at 254 by loading the count values into the timers 220 and 222 (FIG. 9), and the OS proceeds to perform its usual tasks, including the generation of the strobe signal 226 at the regular intervals to prevent the timers 220 and 222 from timing out (FIG. 9), all of which is shown at 256.

At 258 a determination is made on a continual basis as to whether the program interrupt signal 212 (FIG. 9) has been received. Until such time as a program interrupt signal 212 has been received, a loop is established between the steps 258 and 256 to allow the normal OS functionality to proceed. Should a program interrupt signal be received as determined affirmatively at 258, the process flow moves to 260. The dashed arrow connecting 240 and 258 illustrates the relationship between the delivery of the program interrupt signal 212 (FIG. 9) at 240 and the recognition of it by the OS at 258.

At 260, a determination is made whether the program can recover in response to the program interrupt signal. If the OS can recover as determined at 260, the program flow 230 reverts to 256 where normal computer functionality resumes. If the OS cannot recover as determined at 260, the work in progress and data is saved at 262, all processes that may be functioning on the OS are halted at 264, and a wait state is entered at 266 to wait for the receipt of the system reset signal 208 caused by the second timer 222 delivering the watchdog reset signal 216 (FIG. 9). Once the system reset signal 208 (FIG. 9) has been received at 266, the bus reset signal 62 (FIG. 9) is asserted, the entire computer system is reset and the process flow reverts back to 248. The watchdog interrupt functionality at 232–246 may thereafter be invoked when an uninterruptible or lengthy task requires normal OS interrupt signals to be suspended.

As described, the watchdog circuit 264, in conjunction with the CPU 22 and the OS of the computer system 20, provide an opportunity for the computer system to recover from unanticipated suspensions and hung conditions which may occur during the execution of uninterruptible and lengthy tasks, during which the generation of the normal OS interrupt signals will typically have been suspended. The ability to recover is established by the delivery of the program interrupt signal 212 from the first timer 222 (FIG. 9). If the OS is able to recover as a result of the assertion of the program interrupt signal 212, as determined at 260 (FIG. 10), the work in progress and data are saved for later use in troubleshooting or subsequent processing as occurs at 262 (FIG. 10). The additional level or priority of OS interrupts established by the watchdog circuit 264 between the normal OS interrupts and resetting of the entire computer system, provides an opportunity for the OS to recover without having to reset the entire computer system. Of course, once the work in progress and the data have been saved to the main memory 26 (FIG. 1), the present invention assures that the work in progress and data is preserved before the entire computer system is reset.

As described above, the present invention obtains the significant improvement of preserving data under conditions where the data is likely to be lost as a result of a variety of error and malfunction conditions. By monitoring and responding to the functional status of selected key components of the computer system, the vast majority of the malfunction and error conditions are recognized and conveniently funneled, consolidated or channeled into a singular response to place the volatile memory into a safe state and prevent the loss of data under these malfunction or error conditions. The reliability and security of placing the memory into the safe state is improved.

A presently preferred embodiment of the present invention and many of its improvements have been described with a degree of particularity. This description is a preferred example of implementing the invention, and is not necessarily intended to limit the scope of the invention. The scope of the invention is defined by the following claims.

The invention claimed is:

1. A method of placing volatile memory into a safe state in a computer system which includes a central processing unit (CPU) for executing software instructions and a communication bus connecting the CPU and the volatile memory, comprising:
   monitoring for an error condition caused by an absence of a bus clock signal which is normally present on the bus;
   monitoring for an error condition caused by a level of voltage supplied to the volatile memory decreasing to a predetermined threshold which is less than a normally supplied level;
   monitoring for an error condition caused by a presence of a bus reset signal which is normally absent on the bus;
   detecting an error condition from said monitoring; and
   placing the volatile memory into a safe state in response to the detected error condition.

2. A method as defined in claim 1, further comprising:
   monitoring for an error condition caused by a cessation in executing forwardly-progressive software instructions by the CPU.

3. A method as defined in claim 2, wherein:
   the error condition caused by a cessation in executing forwardly-progressive software instructions by the CPU is detected by the absence of executing forwardly-progressive software instructions by the CPU within a predetermined time duration.

4. A method as defined in claim 2, further comprising:
   asserting the bus reset signal in response to detecting the error condition caused by a cessation in executing forwardly-progressive software instructions by the CPU.

5. A method as defined in claim 4, further comprising:
   asserting the bus reset signal in response to a reduction in power within the computer system.

6. A method as defined in claim 5, further comprising:
   Intentionally reducing the power.

7. A method as defined in claim 4, wherein:
   the error condition caused by a cessation in executing forwardly-progressive software instructions by the CPU is detected by the absence of executing forwardly-progressive software instructions by the CPU within a predetermined time duration.

8. A method as defined in claim 1 wherein the computer system further includes a memory controller connected to the volatile memory and the memory controller normally responds to bus clock signals, the method further comprising:
   generating a surrogate bus clock signal after detecting the absence of the bus clock signal normally present on the bus; and
   applying the surrogate bus clock signal to the memory controller to enable the memory controller to complete transactions to the volatile memory.

9. A method as defined in claim 1 wherein the volatile memory is dynamic random access memory (DRAM) which has a self-refresh capability, the method further comprising:
   placing the DRAM in a safe state by enabling the self-refresh capability of the DRAM in response to detecting an error condition.

10. A method as defined in claim 9 wherein the computer system further includes an auxiliary uninterruptible power supply, the method further comprising:
    connecting the auxiliary power supply to the DRAM to power the DRAM in connection with enabling the self-refresh capability.

11. A method as defined in claim 10, further comprising:
    connecting the auxiliary power supply to the DRAM to power the DRAM after the self-refresh capability of the DRAM has been enabled.

12. A method as defined in claim 10, further comprising:
    creating the safe state for the DRAM in response to one of either detecting an error condition or connecting the auxiliary power supply to the DRAM to power the DRAM.

13. A method as defined in claim 1 wherein the computer system further includes an auxiliary uninterruptible power supply, the method further comprising:
    monitoring for a level of voltage supplied to the volatile memory decreasing to a second predetermined threshold which is lower than the first aforesaid predetermined threshold; and
    connecting the auxiliary power supply to power the nonvolatile memory upon the level of voltage decreasing to the second predetermined threshold.

14. A method as defined in claim 1 wherein the computer system further includes a main communication bus connecting the CPU to a main volatile memory and an expansion communication bus connecting the CPU to an intermediate volatile memory, the method further comprising:
    placing the main and intermediate volatile memories into the safe state in response to detecting an error condition.

15. A method as defined in claim 1 wherein the computer system further includes a main communication bus connecting the CPU to a main volatile memory, an expansion communication bus connecting the CPU to an intermediate volatile memory, and a mass storage adapter connected to the expansion communication bus and to which a plurality of mass storage disk drives are connected in a RAID mass storage system, the method further comprising:
    operating the computer system as a mass storage appliance.

16. A method as defined in claim 1 wherein the computer system further includes an auxiliary uninterruptible power supply, the method further comprising:
    connecting the auxiliary power supply to the volatile memory to power the volatile memory in response to detecting an error condition.

17. A method as defined in claim 16, further comprising:
    storing a signal in the volatile memory indicative of enabling the connection of the auxiliary power supply to the volatile memory in response to detecting an error condition;
    resetting the computer system after a power reduction; and thereafter:
    sensing the signal in the volatile memory indicative of enabling the connection of the auxiliary power supply to the volatile memory; and
    recovering data preserved in the volatile memory when the volatile memory was placed in the safe state.

18. A method as defined in claim 17 wherein the computer system further includes a mass storage adapter connected to the bus and to which a plurality of mass storage disk drives are connected in a RAID mass storage configuration, the method further comprising:

operating the computer system as a mass storage appliance performing mass storage transactions; and replaying logs of memory transactions which occurred prior to the occurrence of an error condition;

recovering data preserved in the volatile memory when the volatile memory was placed in the safe state; and writing the recovered data to at least one of the mass storage disk drives of the RAID mass storage system.

19. A method as defined in claim 1 wherein the computer system operates in one of an initiate functionality state, an initialize memory state, a normal functionality state or a clean power-down state, and further comprising:

placing the volatile memory in the safe state upon detecting an error condition when operating in any one of the initiate functionality, initialize memory, normal functionality or clean power-down states.

20. A method as defined in claim 19 wherein the computer system further operates in a replay logs state, and further comprising:

placing the volatile memory in the safe state during any one of the initiate functionality, initialize memory, normal functionality, clean power-down or replay logs states.

21. A computer system comprising a central processing unit (CPU) that executes software instructions, a memory component, and a communication bus connecting the CPU to the memory component, the bus normally carrying a bus clock signal, the bus also carrying a bus reset signal in connection with resetting the computer system, the memory component comprising:

a volatile memory having a self-generating data-preserving safe state of operation which is enabled in response to applying a safe state enable signal to the volatile memory;

an error condition logic circuit connected to the bus to receive the bus reset signal asserted on the bus, the error condition logic also connected to the volatile memory to apply the safe state enable signal to the volatile memory;

a bus clock generator circuit connected to the bus to receive the bus clock signal, the bus clock generator asserting a bus clock absence signal upon detecting an absence of the bus clock signal, the bus clock generator connected to the error condition logic circuit to supply the bus clock absence signal to the error condition logic circuit;

a power monitor circuit connected to the volatile memory to power the volatile memory and to monitor a level of voltage supplied to the volatile memory, the power monitor circuit asserting a low voltage warning signal upon the voltage level decreasing to a predetermined threshold which is lower than a level of voltage which is normally supplied to the volatile memory, the power monitor circuit connected to the error condition logic circuit to supply the low voltage warning signal to the error condition logic circuit; and the error condition logic applying the safe state enable signal to the volatile memory in response to the assertion of any one of the bus reset signal, bus clock absence signal, or the low voltage warning signal.

22. A computer system as defined in claim 21, further comprising:

a watchdog circuit connected to the CPU to monitor the execution of software instructions by the CPU, the watchdog circuit asserting a system reset signal to the CPU which causes the CPU to assert the bus reset signal upon the watchdog circuit detecting a cessation in the execution of forwardly-progressive software instructions by the CPU.

23. A computer system as defined in claim 22, further comprising:

a reset circuit connected to the CPU which asserts a signal to the CPU which causes the CPU to assert the bus reset signal upon activating the reset circuit.

24. A computer system as defined in claim 22, wherein:

the watchdog circuit asserts the system reset signal to the CPU upon detecting the absence of executing forwardly-progressive instructions by the CPU within a predetermined time duration.

25. A computer system as defined in claim 24, wherein:

the watchdog circuit asserts a program interrupt signal to the CPU upon detecting the absence of executing forwardly-progressive instructions by the CPU within a second predetermined time duration which is less than the predetermined time duration first aforesaid, the CPU responding to the assertion of the program interrupt signal to attempt to commence the execution of forwardly-progressive instructions without asserting the bus reset signal.

26. A computer system as defined in claim 21, wherein:

the bus clock generator circuit further generates a surrogate bus clock signal as a replacement for the bus clock signal upon detecting the absence of the bus clock signal normally present on the bus.

27. A computer system as defined in claim 26, further comprising:

a memory controller connected to the volatile memory and operative to perform memory transactions on the volatile memory, the memory controller operating in response to clock signals; and wherein:

the bus, clock generator is connected to the memory controller to supply the surrogate bus clock signal as the clock signal to the memory controller.

28. A computer system as defined in claim 27, wherein:

the bus clock generator supplies the surrogate bus clock signal having essentially identical characteristics to the bus clock signal and with the surrogate bus clock signal having essentially zero time and phase delay relative to the normally supplied bus clock signal.

29. A computer system as defined in claim 28, wherein:

the bus clock generator supplies the surrogate bus clock signal for a time after the absence of the bus clock signal which is sufficient for the memory controller to complete memory transactions necessary to write data in the volatile memory for preservation while the volatile memory is thereafter in the safe state.

30. A computer system as defined in claim 27, wherein:

the bus clock generator further includes an oscillator which generates the surrogate bus clock signal and a phase locked loop connected to the oscillator to deliver the surrogate bus clock signal with essentially a zero time delay relative to the bus clock signal.

31. A computer system as defined in claim 30, wherein:

the bus clock generator further includes a bus clock absence detection circuit to detect the cessation of the bus clock signal and to assert the bus clock absence signal in response to the detection of cessation of the normal bus clock signal, the bus clock absence detection circuit further comprising:

a first circuit element responsive to the bus clock signal for supplying a first signal having a first characteristic related to changing states of the normal bus clock signal;

a second circuit element responsive to the surrogate bus clock signal for supplying a second signal having a second characteristic related to changing states of the surrogate bus clock signal; and a third circuit element responsive to the first and second signals for comparing the changing states of the normal and surrogate bus clock signals and for initiating delivery of the bus clock absence signal upon detecting that the states of the normal bus clock signal are not changing relative to the states of the surrogate bus clock signal.

32. A computer system as defined in claim 31, wherein: the third circuit is a signal comparing logic circuit element which compares logical states of the first and second signals.

33. A computer system as defined in claim 32, wherein: the first and second circuit elements comprise first and second flip-flops, respectively.

34. A computer system as defined in claim 32, wherein: the first circuit element comprises a first flip-flop which includes a clock terminal, an input terminal, an output terminal and an inverted output terminal, the clock terminal of the first flip-flop is connected to receive the normal bus clock signal, the inverted output terminal of the first flip-flop is connected to the input terminal of the first flip-flop, and the output terminal of the first flip-flop supplies the first signal at a frequency which is less than a frequency of the normal bus clock signal;

the second circuit element comprises a second flip-flop which includes a clock terminal, an input terminal, and an output terminal, the clock terminal of the second flip-flop is connected to receive the surrogate bus clock signal, the input terminal of the second flip-flop is connected to the output terminal of the first flip-flop to receive the first signal, and the output terminal of the second flip-flop supplies the second signal which is a delayed version of the first signal and which appears as an inversion of the first signal while the normal bus clock signal continues; and the third circuit element comprises a logic gate having two input terminals and one output terminal, one input terminal of the logic gate connected to the output terminal of the first flip-flop to receive the first signal and the other input terminal of the logic gate connected to the output terminal of the second flip-flop to receive the second signal, the logic gate supplying a comparison signal at its output terminal which initiates the delivery of the bus clock absence signal upon the first and second signals ceasing to occupy mutually opposite digital logical states.

35. A computer system as defined in claim 34, further comprising:
a third flip-flop which includes a clock terminal, an input terminal and an output terminal, the clock terminal of the third flip-flop is connected to receive the surrogate bus clock signal, the input terminal of the third flip-flop is connected to the output terminal of the logic gate, and the output terminal of the third flip-flop supplies the bus clock absence signal.

36. A computer system as defined in claim 35 wherein: the logic gate comprises an exclusive OR gate.

37. A computer system as defined in claim 21, further comprising:

an auxiliary uninterruptible power supply; and wherein:
the power monitor further includes a power selector which is connected to the level of voltage supplied to the volatile memory under normal operating conditions and to the auxiliary power supply, the power selector responds to a further decrease in the level of voltage supplied to the volatile memory to a second predetermined threshold level below the predetermined threshold first aforesaid at which the low voltage warning signal is asserted, the power selector operatively connecting the auxiliary power supply to the volatile memory to power the volatile memory from the auxiliary power supply in response to the level of voltage supplied to the volatile memory decreasing to the second predetermined threshold.

38. A computer system as defined in claim 37, wherein:
the voltage monitor is receptive of electrical power applied to the volatile memory, the voltage monitor operatively determining whether the voltage level of power applied to volatile memory falls below the first predetermined threshold and below the second predetermined threshold, the second predetermined threshold being lower than the first predetermined threshold, the voltage monitor supplying the low voltage warning signal upon the voltage level falling below the first threshold, the voltage monitor supplying a power selection signal to the power selector upon the voltage level falling below the second threshold; and the power selector responding to the power selection signal to connect the auxiliary power supply to energize the volatile memory from the auxiliary power supply in response to the power selection signal.

39. A computer system as defined in claim 38, wherein:
the voltage monitor is further receptive of a voltage level from an internal power supply applied principally to components of the computer system other than the volatile memory, the voltage monitor determining whether the level of voltage of the internal power supply falls below a third predetermined threshold signifying a minimum voltage level for operating the computer system, the voltage monitor supplying the low voltage warning signal upon one of the voltage level of the power applied to the volatile memory falling below the first predetermined threshold or the voltage level of the internal power supply falling below the third predetermined threshold.

40. A computer system as defined in claim 37, further comprising:
the voltage monitor is receptive of the level of voltage applied to the volatile memory and also receptive of a level of voltage of applied principally to circuitry other than the volatile memory within the computer system;
the voltage monitor determines whether the voltage level applied to the other circuitry falls below one predetermined voltage threshold signifying a minimum voltage level for operation of circuitry other than the volatile memory the voltage monitor determines whether the voltage level applied to the volatile memory falls below another predetermined voltage threshold signifying a minimum voltage level for operation of the volatile memory; and
the voltage monitor supplies the low voltage warning signal if the voltage level falls below the one or the other predetermined voltage thresholds.

41. A computer system as defined in claim 37, wherein:
the volatile memory comprises a dynamic random access memory (DRAM), the DRAM has a self-refresh mode of functionality for the DRAM which is selectable in response to a self-refresh enable signal applied to the DRAM;

the safe state enable signal constitutes the self-refresh enable signal; and the self-refresh enable signal is applied to the DRAM before the auxiliary power supply is connected to power the DRAM.

* * * * *